(12) United States Patent
Kim et al.

(10) Patent No.: US 9,281,235 B2
(45) Date of Patent: Mar. 8, 2016

(54) SEMICONDUCTOR PACKAGES AND METHODS OF FORMING THE SAME

(71) Applicant: Samsung Electronics Co., Ltd., Suwon-si, Gyeonggi-do (KR)

(72) Inventors: Young-lyong Kim, Gunpo-si (KR); Taehoon Kim, Seongnam-si (KR); Jongho Lee, Hwaseong-si (KR); Chul-Yong Jang, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/613,154

(22) Filed: Feb. 3, 2015

(65) Prior Publication Data

US 2015/0155199 A1  Jun. 4, 2015

Related U.S. Application Data

(62) Division of application No. 13/546,163, filed on Jul. 11, 2012, now Pat. No. 8,970,046.

(30) Foreign Application Priority Data

Jul. 18, 2011  (KR) .................. 10-2011-0071016
Mar. 23, 2012  (KR) .................. 10-2012-0029739

(51) Int. Cl.
*H01L 21/768*  (2006.01)
*H01L 25/00*  (2006.01)
(Continued)

(52) U.S. Cl.
CPC ...... *H01L 21/76802* (2013.01); *H01L 23/3135* (2013.01); *H01L 23/3185* (2013.01);
(Continued)

(58) Field of Classification Search
CPC ..... H01L 23/3185; H01L 24/24; H01L 24/82; H01L 25/0657; H01L 25/50; H01L 21/76802; H01L 2224/24146; H01L 2224/24227
USPC .......... 438/107, 109, 125, 597; 257/686, 779, 257/777, E21.502
See application file for complete search history.

(56) References Cited

U.S. PATENT DOCUMENTS 6,621,155 B1  9/2003  Perino et al.
7,019,398 B2  3/2006  Matsuo
(Continued)

FOREIGN PATENT DOCUMENTS

CN  1720354 A  1/2006
CN  101006582 A  7/2007
(Continued)

*Primary Examiner* — Thinh T Nguyen
(74) *Attorney, Agent, or Firm* — Harness, Dickey & Pierce, P.L.C.

(57) ABSTRACT

A semiconductor package may include a substrate including a substrate connection terminal, at least one semiconductor chip stacked on the substrate and having a chip connection terminal, a first insulating layer covering at least portions of the substrate and the at least one semiconductor chip, and/or an interconnection penetrating the first insulating layer to connect the substrate connection terminal to the chip connection terminal. A semiconductor package may include stacked semiconductor chips, edge portions of the semiconductor chips constituting a stepped structure, and each of the semiconductor chips including a chip connection terminal; at least one insulating layer covering at least the edge portions of the semiconductor chips; and/or an interconnection penetrating the at least one insulating layer to connect to the chip connection terminal of each of the semiconductor chips.

15 Claims, 28 Drawing Sheets

(51) Int. Cl.
*H01L 23/00* (2006.01)
*H01L 25/065* (2006.01)
*H01L 23/31* (2006.01)

(52) U.S. Cl.
CPC ............... *H01L24/24* (2013.01); *H01L 24/82* (2013.01); *H01L 25/0657* (2013.01); *H01L 25/50* (2013.01); *H01L 23/3121* (2013.01); *H01L 2224/24146* (2013.01); *H01L 2224/24225* (2013.01); *H01L 2224/24226* (2013.01); *H01L 2224/24227* (2013.01); *H01L 2224/32145* (2013.01); *H01L 2224/32225* (2013.01); *H01L 2224/73267* (2013.01); *H01L 2224/76155* (2013.01); *H01L 2224/82102* (2013.01); *H01L 2224/92144* (2013.01); *H01L 2225/06524* (2013.01); *H01L 2225/06562* (2013.01); *H01L 2225/06568* (2013.01); *H01L 2924/01012* (2013.01); *H01L 2924/01029* (2013.01); *H01L 2924/181* (2013.01)

(56) References Cited

U.S. PATENT DOCUMENTS

| | | | |
|---|---|---|---|
| 7,208,347 B2 | 4/2007 | Seliger et al. | |
| 7,615,853 B2 | 11/2009 | Shen et al. | |
| 7,858,439 B2 | 12/2010 | Kim | |
| 8,723,332 B2 * | 5/2014 | McElrea et al. | 257/777 |
| 2004/0108217 A1 | 6/2004 | Dubin | |
| 2005/0230263 A1 | 10/2005 | Dubin | |
| 2006/0006552 A1 | 1/2006 | Kang et al. | |
| 2006/0267173 A1 | 11/2006 | Takiar et al. | |
| 2008/0111230 A1 * | 5/2008 | Kim et al. | 257/700 |
| 2008/0303131 A1 * | 12/2008 | McElrea et al. | 257/686 |
| 2010/0090347 A1 | 4/2010 | Saylor et al. | |
| 2011/0024893 A1 | 2/2011 | Kim | |

FOREIGN PATENT DOCUMENTS

| | | |
|---|---|---|
| KR | 20070048952 A | 5/2007 |
| KR | 100920039 B1 | 10/2009 |
| KR | 101013545 B1 | 2/2011 |

* cited by examiner

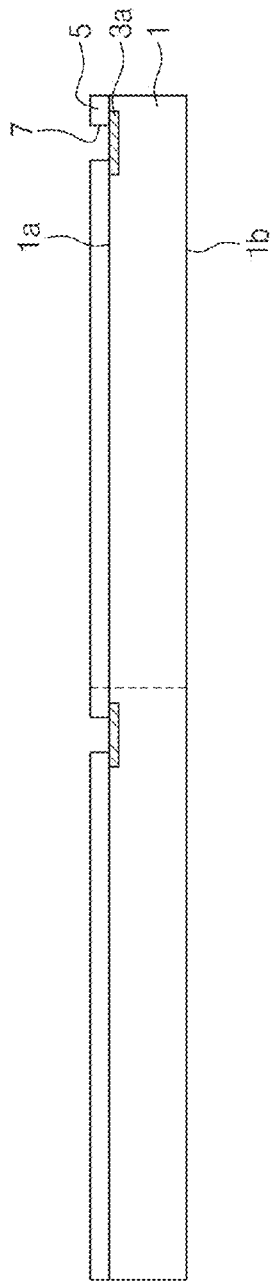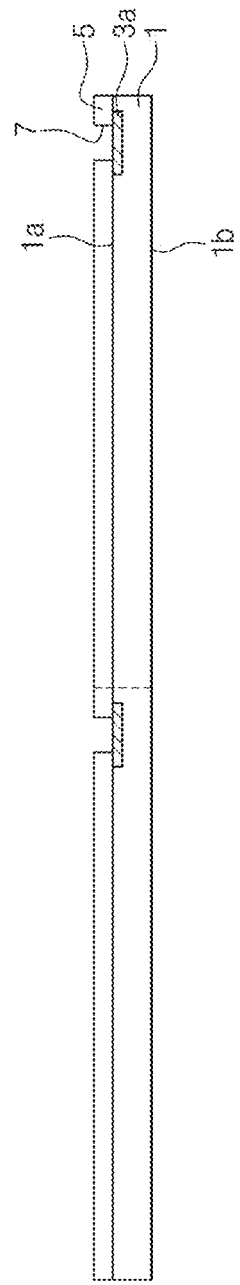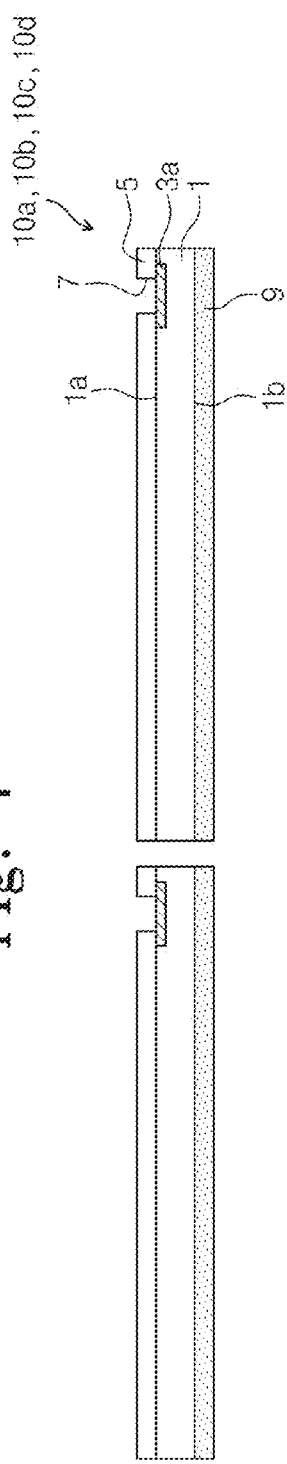

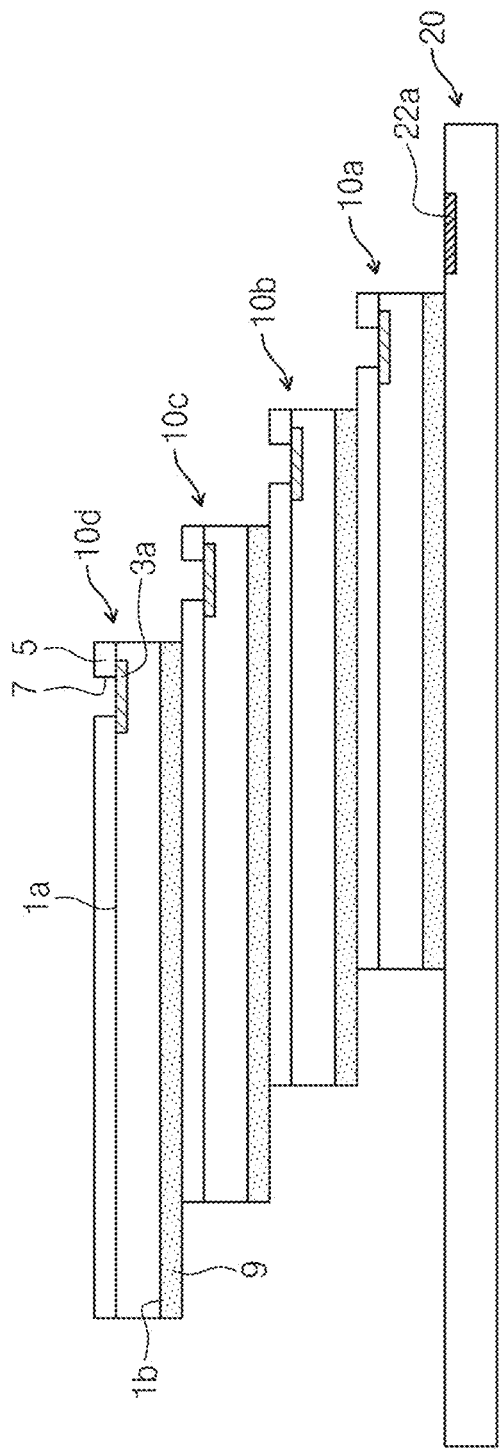

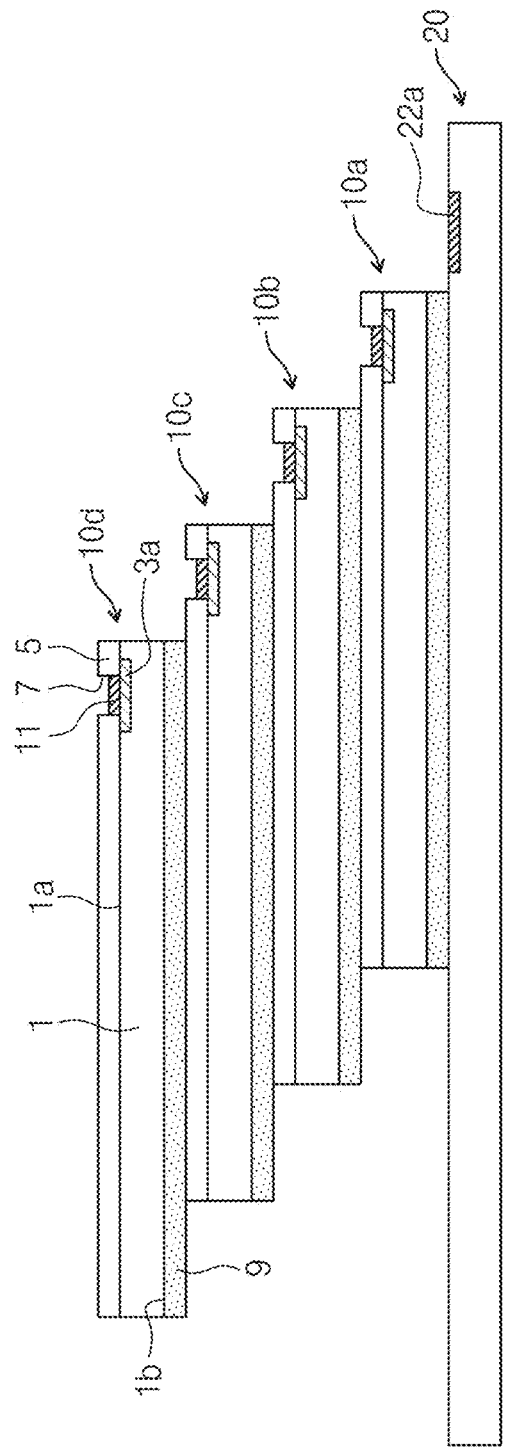

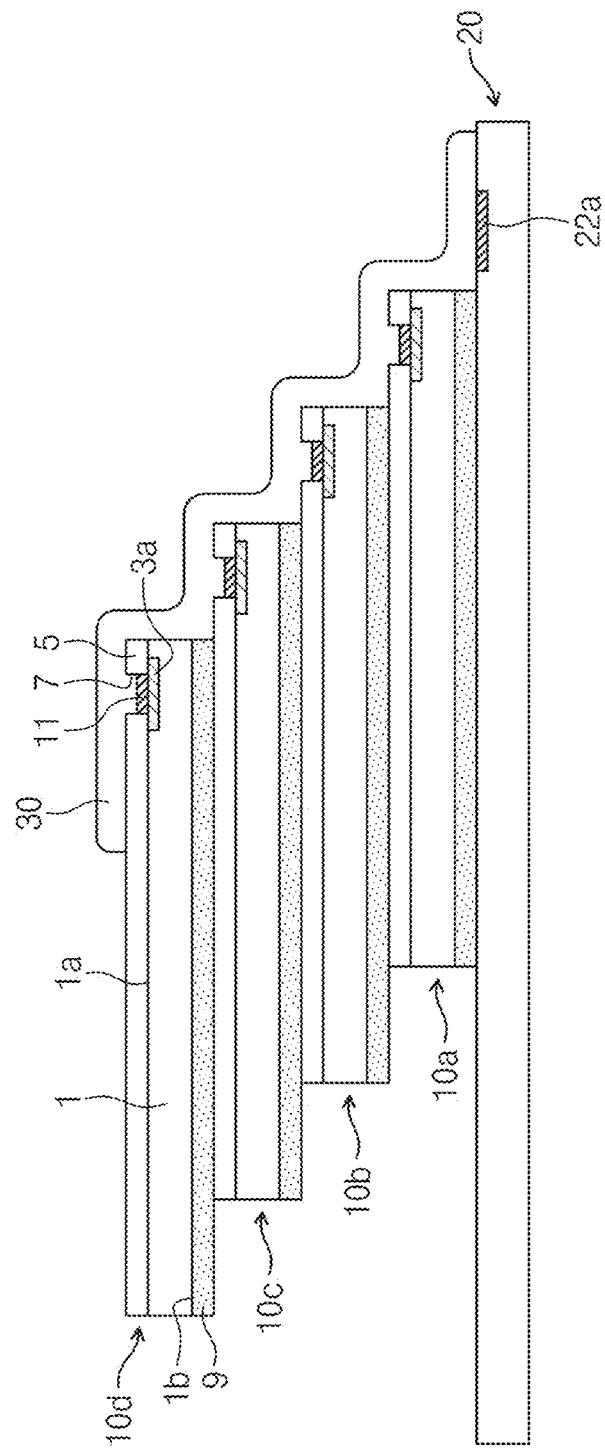

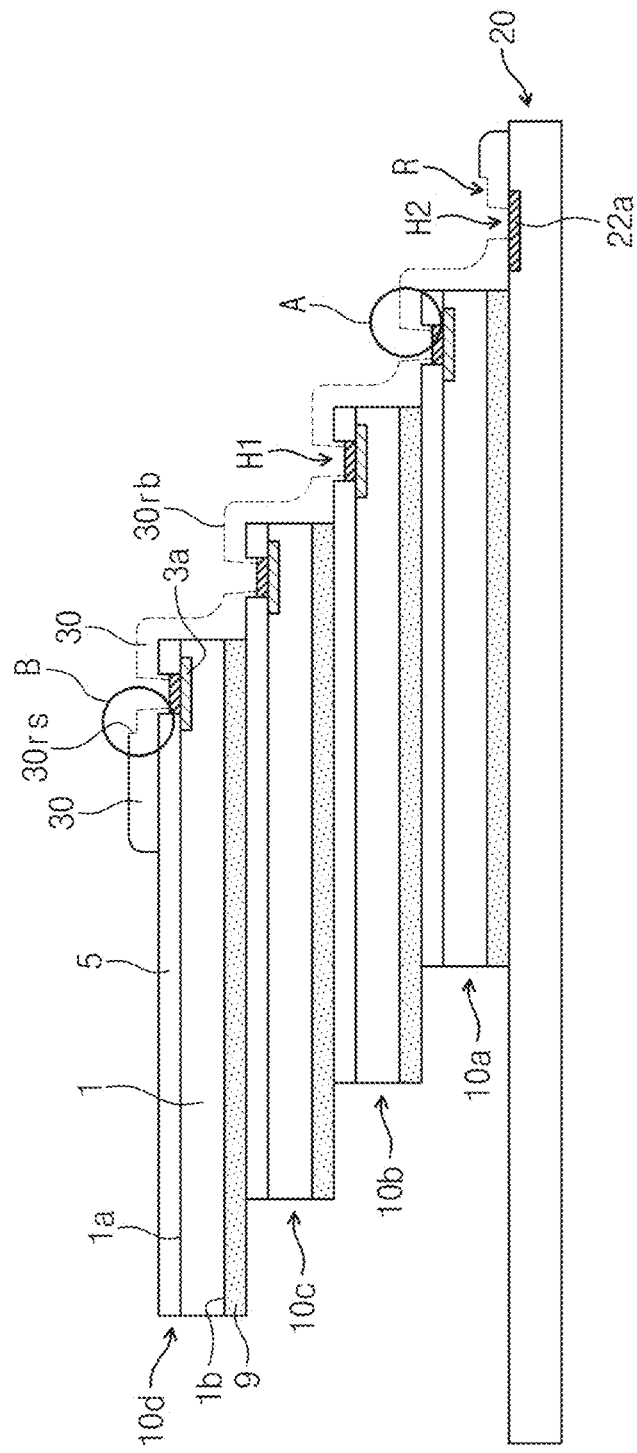

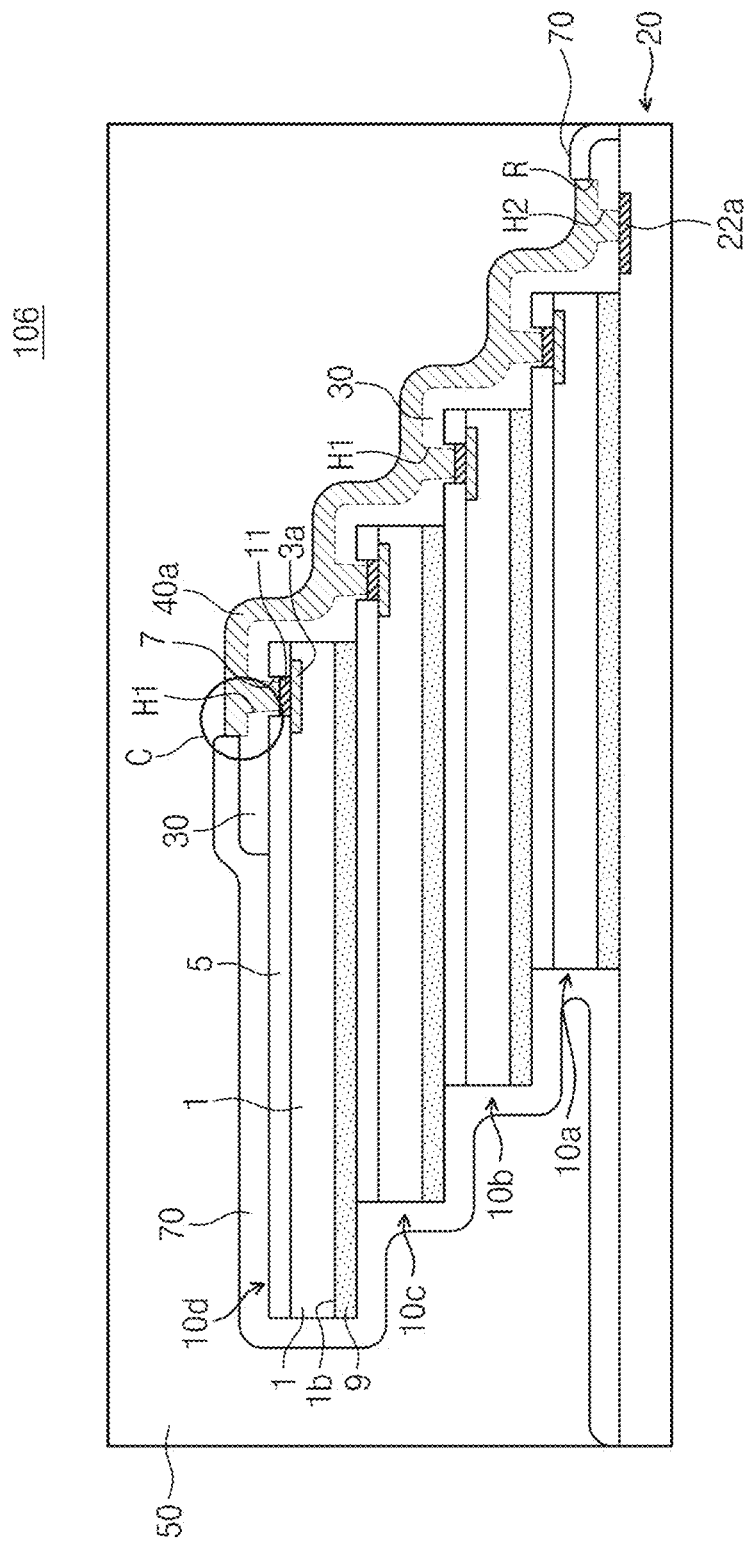

SEMICONDUCTOR PACKAGES AND METHODS OF FORMING THE SAME

CROSS-REFERENCE TO RELATED APPLICATION(S)

This U.S. non-provisional application is a divisional under 35 U.S.C. §121 of U.S. application Ser. No. 13/546,163, filed on Jul. 11, 2012, which claims priority under 35 U.S.C. §119 to Korean Application No. 10-2011-0071016, filed on Jul. 18, 2011 with the Korean Intellectual Property Office (KIPO), and Korean Application No. 10-2012-0029739, filed on Mar. 23, 2012 with KIPO, the entire contents of each of which are incorporated herein by reference.

BACKGROUND

1. Field

Example embodiments relate to semiconductor packages and methods of forming the same.

2. Description of Related Art

High function, high speed, and small size of electronic components have been increasingly demanded with development of an electronic industry. For correspondence to the trend, it is required to mount semiconductor chips of various kinds, instead of semiconductor chips of the same kind, in a single semiconductor package. However, since the kinds of the semiconductor chips are different from each other, sizes and/or functions of the semiconductor chips may be different from each other. Accordingly, problems such as an increase of a horizontal size of the semiconductor package or a wire sweeping may be caused. Additionally, a gold used as the wire may be expensive and a wiring process may require a long process time. Thus, productivity of the semiconductor packages may be decreased.

SUMMARY

Example embodiments may provide semiconductor packages capable of improving the degree of freedom of an interconnection.

Example embodiments also may provide methods of forming semiconductor packages capable of improving productivity.

In some example embodiments, a semiconductor package may comprise a substrate including a substrate connection terminal, at least one semiconductor chip stacked on the substrate and having a chip connection terminal, a first insulating layer covering at least portions of the substrate and the at least one semiconductor chip, and/or an interconnection penetrating the first insulating layer to connect the substrate connection terminal to the chip connection terminal.

In some example embodiments, the first insulating layer may include a polymer layer and metal-containing particles dispersed in the polymer layer.

In some example embodiments, the interconnection may include an electroless plating layer.

In some example embodiments, the first insulating layer may include holes exposing the substrate connection terminal, the chip connection terminal, and a recessed region. The interconnection may be in the recessed region and the holes.

In some example embodiments, surface roughness of a sidewall and a bottom of the recessed region may be greater than surface roughness of a top surface of the first insulating layer. Surface roughness of inner sidewalls of the holes may be greater than the surface roughness of the top surface of the first insulating layer.

In some example embodiments, the at least one semiconductor chip may further comprise a protection layer including an opening partially exposing the chip connection terminal and/or a laser blocking pattern in the opening. The laser blocking pattern may be in contact with the chip connection terminal.

In some example embodiments, the laser blocking pattern may include at least one of gold, nickel, and lead.

In some example embodiments, the at least one semiconductor chip may be provided in plural, and the plurality of semiconductor chips may be stacked on the substrate. Edge portions of the semiconductor chips may constitute a stepped structure on the substrate. The first insulating layer may extend to conformally cover top surfaces, sidewalls, and bottom surfaces of the semiconductor chips and a top surface of the substrate.

In some example embodiments, the at least one semiconductor chip may further include a dummy chip connection terminal under the first insulating layer. The dummy chip connection terminal may be vertically overlapped with the interconnection and is insulated from the interconnection.

In some example embodiments, the chip connection terminal may be provided in a plural number to the at least one semiconductor chip. The first insulating layer may extend to simultaneously contact the chip connection terminals that neighbor each other.

In some example embodiments, the substrate connection terminal may include a first substrate connection terminal and a second substrate connection terminal. The chip connection terminal may include a first chip connection terminal and a second chip connection terminal. The interconnection may include a first interconnection connecting the first substrate connection terminal to the first chip connection terminal, and a second interconnection connecting the second substrate connection terminal to the second chip connection terminal. The first insulating layer may include a first insulating layer under the first interconnection, and a second insulating layer between the first interconnection and the second interconnection.

In some example embodiments, the semiconductor package may further comprise a second insulating layer covering the first insulating layer adjacent to the interconnection, the at least one semiconductor chip, and the substrate.

In some example embodiments, the at least one semiconductor chip may be provided in plural, end portions of the semiconductor chips constitute a stepped structure, and the chip connection terminals are on the end portions of the semiconductor chips and are exposed. The first insulating layer may cover the end portions of the semiconductor chips and exposes the chip connection terminals. The interconnection may be on the first insulating layer and connects the chip connection terminals to each other. The second insulating layer may conformally cover the first insulating layer not covered by the interconnection, top surfaces, sidewalls, and bottom surfaces of the semiconductor chips, and a top surface of the substrate.

In some example embodiments, the first insulating layer may include a recessed region and holes exposing the substrate connection terminal and the chip connection terminals. The second insulating layer may include a sidewall aligned with a sidewall of the recessed region.

In some example embodiments, surface roughness of the sidewall of the second insulating layer may be greater than surface roughness of a top surface of the second insulating layer.

In some example embodiments, the second insulating layer may not include metal-containing particles.

In some example embodiments, the second insulating layer may include at least one of parylene, teflon, and epoxy mold compound.

In some example embodiments, a semiconductor package may comprise stacked semiconductor chips, edge portions of the semiconductor chips constituting a stepped structure, and each of the semiconductor chips including a chip connection terminal; at least one insulating layer covering at least the edge portions of the semiconductor chips; and/or an interconnection penetrating the at least one insulating layer to connect to the chip connection terminal of each of the semiconductor chips.

In some example embodiments, a method of forming a semiconductor package may comprise preparing a substrate including a substrate connection terminal, stacking at least one semiconductor chip including a chip connection terminal on the substrate, forming a first insulating layer to cover the substrate connection terminal and the chip connection terminal, and/or forming an interconnection penetrating the first insulating layer, the interconnection electrically connecting the chip connection terminal to the substrate connection terminal.

In some example embodiments, the interconnection may be formed using an electroless plating method.

In some example embodiments, the first insulating layer may include a polymer layer and metal-containing particles dispersed in the polymer layer. The method, before forming the interconnection, may further comprise irradiating a laser to partially remove the polymer layer, thereby forming a recessed region at a surface of the first insulating layer and holes exposing the chip connection terminal and the substrate connection terminal, and thereby leaving the metal-containing particles in the recessed region and the holes at the same time.

In some example embodiments, the laser may break a bind ring between a non-metal atom and a metal in the metal-containing particles to form a seed layer including the metal.

In some example embodiments, the method may further comprise performing a pre-treatment process removing an insulating material of the metal-containing particles to form the seed layer including the metal in the metal-containing particles before forming the interconnection.

In some example embodiments, forming the first insulating layer may comprise performing a chemical vapor deposition process to conformally form the first insulating layer on a top surface, a sidewall, and a bottom surface of the at least one semiconductor chip and a top surface of the substrate. The polymer layer may include parylene.

In some example embodiments, the laser may be an infrared laser.

In some example embodiments, the may further comprise forming a laser blocking pattern on the chip connection terminal. The laser may be irradiated to expose the laser blocking pattern on the chip connection terminal.

In some example embodiments, the method may further comprise forming a second insulating layer to cover the substrate, the at least one semiconductor chip, and the first insulating layer. The interconnection may penetrate the second insulating layer and the first insulating layer.

In some example embodiments, the second insulating layer may not include metal-containing particles.

In some example embodiments, the first insulating layer may include a polymer layer and metal-containing particles dispersed in the polymer layer. The method, before forming the interconnection, may further comprise irradiating a laser to partially remove the second insulating layer and the polymer layer, thereby forming a recessed region at a surface of the first insulating layer and holes exposing the chip connection terminal and the substrate connection terminal, and thereby leaving the metal-containing particles in the recessed region and in the holes at the same time.

In some example embodiments, a method of forming a semiconductor package may comprise stacking a second semiconductor chip including a second chip connection terminal on a first semiconductor chip including a first chip connection terminal, forming at least one insulating layer to cover the first chip connection terminal and the second chip connection terminal, and/or forming an interconnection penetrating the at least one insulating layer to electrically connect the first chip connection terminal to the second chip connection terminal.

In some example embodiments, a semiconductor package may comprise a substrate, at least one semiconductor chip on the substrate, a first insulating layer on the substrate and the at least one semiconductor chip, and/or an interconnection that penetrates the first insulating layer. The substrate may include a substrate connection terminal. The at least one semiconductor chip may include a chip connection terminal. The first insulating layer may cover at least the substrate connection terminal and the chip connection terminal. The interconnection may electrically connect the substrate connection terminal and the chip connection terminal.

In some example embodiments, the semiconductor package may further comprise two or more semiconductor chips stacked on the substrate. Each of the two or more semiconductor chips may include a chip connection terminal. The first insulating layer may cover at least the substrate connection terminal and the chip connection terminals. The interconnection may electrically connect the substrate connection terminal and the chip connection terminals.

BRIEF DESCRIPTION OF THE DRAWINGS

The above and/or other aspects and advantages will become more apparent and more readily appreciated from the following detailed description of example embodiments, taken in conjunction with the accompanying drawings, in which:

FIGS. 5 through 12 show a method of forming a semiconductor package having the cross-sectional view of FIG. 2;

FIGS. 22A and 22B are cross-sectional views taken along a line I-I' and a line II-IF of FIG. 21, respectively;

DETAILED DESCRIPTION

Figure 1:
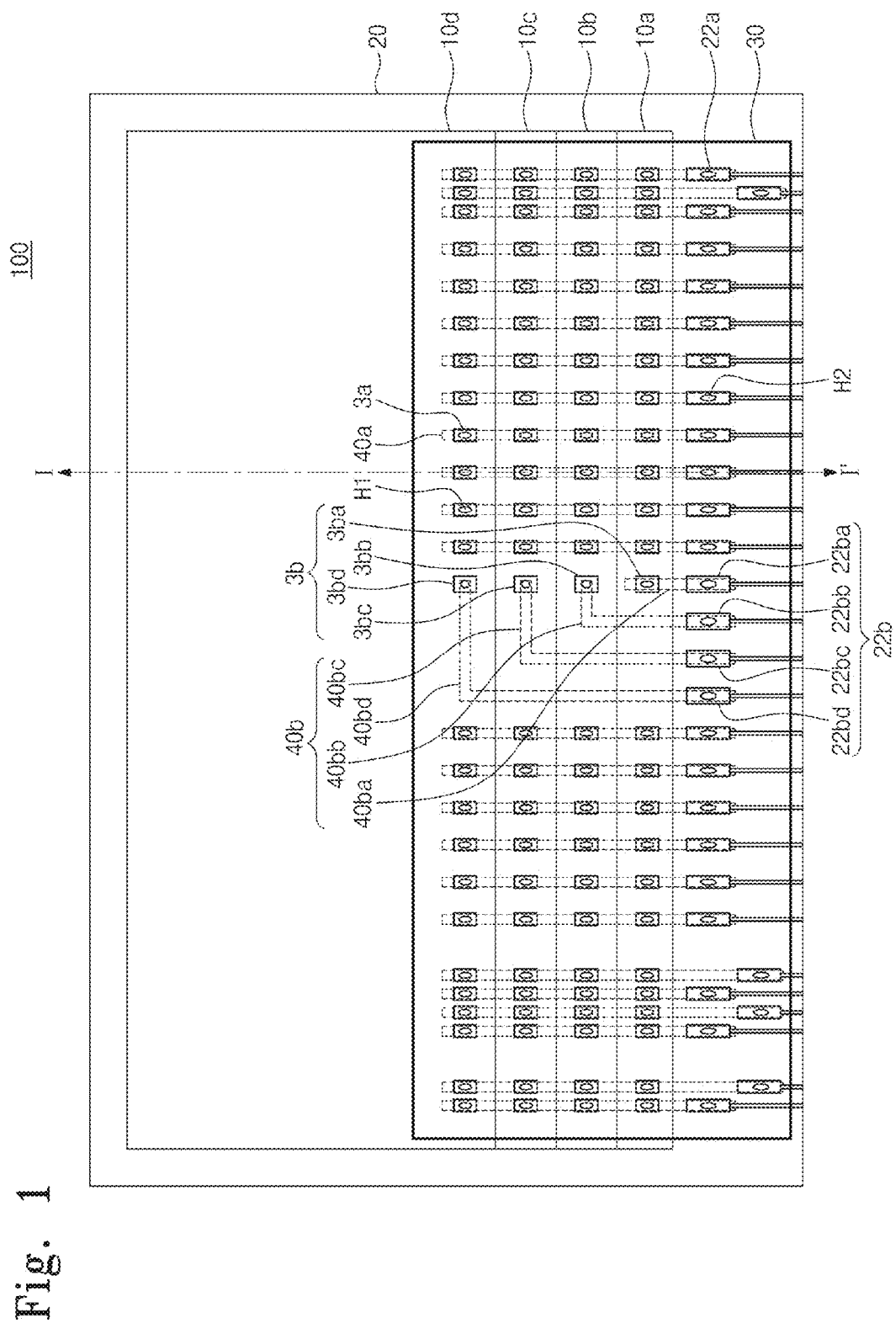
FIG. 1 is a layout illustrating a semiconductor package according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

First Embodiment

Figure 2:
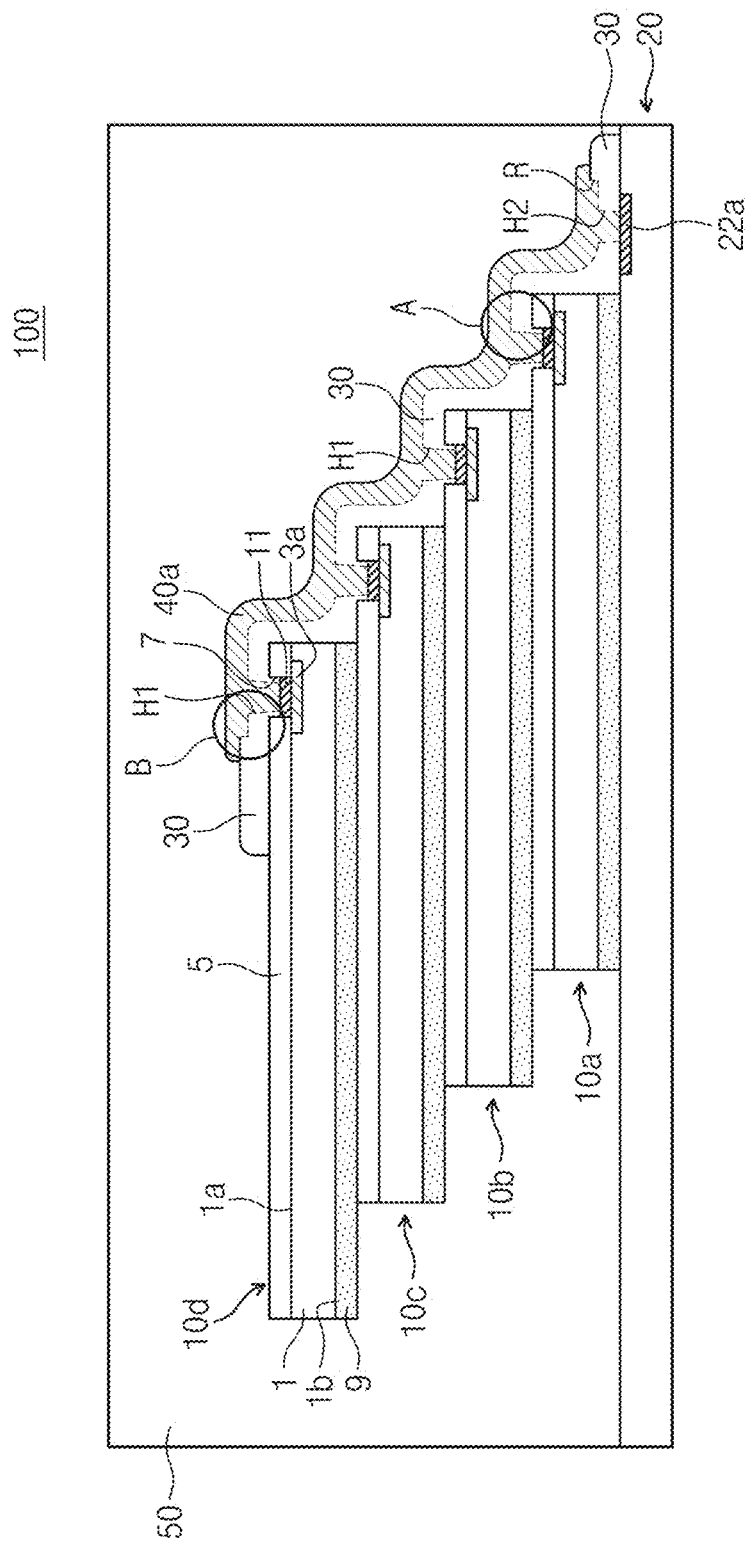
FIG. 2 is a cross-sectional view taken along a line I-I' of FIG. 1.
Figure 3A:
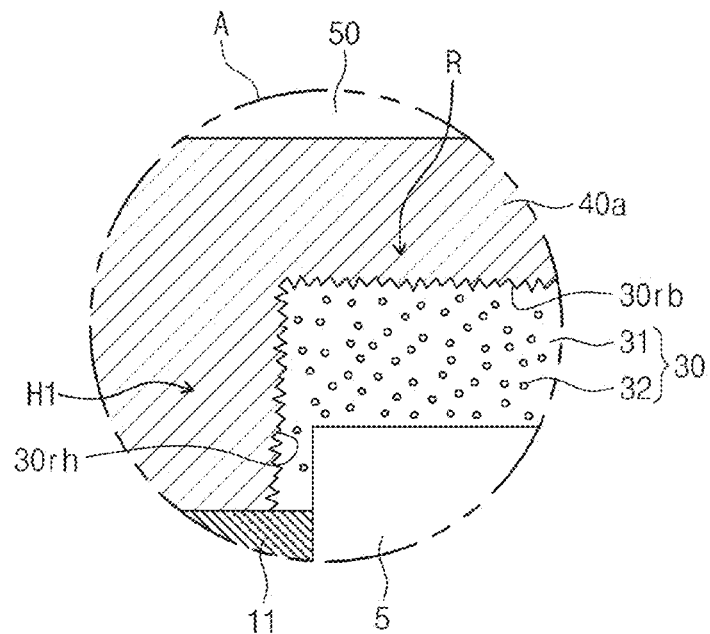
FIGS. 3A and 3B are enlarged cross-sectional views of a portion 'A' and a portion 'B' of FIG. 2, respectively.
Figure 3B:
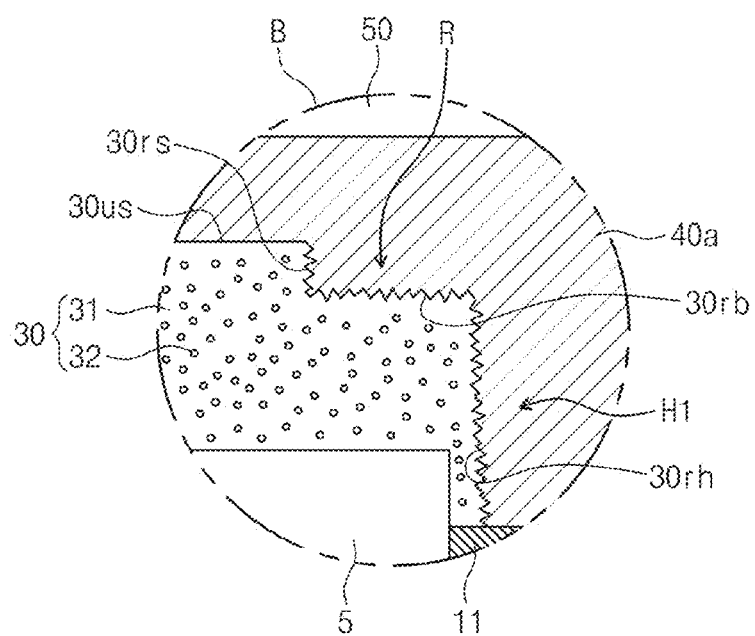

FIG. 1 is a layout illustrating a semiconductor package according to some example embodiments. FIG. 2 is a cross-sectional view taken along a line I-I' of FIG. 1. FIGS. 3A and 3B are enlarged cross-sectional views of a portion 'A' and a portion 'B' of FIG. 2, respectively.

Referring to FIGS. 1 and 2, in a semiconductor package 100 according to the present embodiment, a plurality of semiconductor chips 10a, 10b, 10c, and 10d are stacked on a package substrate 20. The plurality of semiconductor chips 10a, 10b, 10c, and 10d may include a first semiconductor chip 10a, a second semiconductor chip 10b, a third semiconductor chip 10c, and a fourth semiconductor chip 10d being sequentially stacked. In the present embodiment, the semiconductor chips 10a, 10b, 10c, and 10d may be the same kinds as each other. Each of the semiconductor chips 10a, 10b, 10c, and 10d includes a chip body 1. The chip body 1 may include a semiconductor substrate, circuit patterns thereon, and interlayer insulating layers covering these. The chip body 1 includes a first surface 1a and a second surface 1b opposite to each other. A plurality of first chip connection terminals 3a and a second chip connection terminal 3b are disposed on the first surface 1a. The first chip connection terminals 3a and the second connection terminal 3b may correspond to conductive pads disposed at an uppermost surface of the interlayer insulating layers in the chip body 1. The first chip connection terminals 3a may include a ground pin, a power pin, a data pin, an address pin, and a command pin. The second chip connection terminal 3b may correspond to a chip enable pin. The second chip connection terminal 3b of the first semiconductor chip 10a may correspond to a first chip enable pin 3ba. The second chip connection terminal 3b of the second semiconductor chip 10b may correspond to a second chip enable pin 3bb. The second chip connection terminal 3b of the third semiconductor chip 10c may correspond to a third chip enable pin 3bc. The second chip connection terminal 3b of the fourth semiconductor chip 10d may correspond to a fourth chip enable pin 3bd.

A protection layer 5 is disposed on the first surface 1a. The protection layer 5 includes an opening 7 exposing each of the chip connection terminals 3a and 3b. A laser blocking pattern 11 is disposed in the opening 7 to be in contact with each of the chip connection terminals 3a and 3b. The laser blocking pattern 11 may be formed of a conductive material not absorbing but reflecting energy of a laser. For example, the laser blocking pattern 11 may include at least one selected from a group including nickel (Ni), lead (Pb), and gold (Au), etc. Adhesion layer 9 is disposed on the second surface 1b. The adhesion layer 9 performs a function to adhere the semiconductor chips 10a, 10b, 10c, and 10d and the package substrate 20 to each other.

First substrate connection terminals 22a and second substrate connection terminals 22b are disposed on the package substrate 20. The first substrate connection terminals 22a and the second substrate connection terminals 22b may include the same material as the laser blocking pattern 11. The first substrate connection terminals 22a may be connected to the first chip connection terminals 3a. The second substrate connection terminals 22b may include a first chip enable substrate pin 22ba selecting the first semiconductor chip 10a, a second chip enable substrate pin 22bb selecting the second semiconductor chip 10b, a third chip enable substrate pin 22bc selecting the third semiconductor chip 10c, and a fourth chip enable substrate pin 22bd selecting the fourth semiconductor chip 10d.

Referring to FIGS. 1, 2, 3A, and 3B, edge portions of the semiconductor chips 10a, 10b, 10c, and 10d and an edge portion of the package substrate 20 are covered by an insulating layer 30. The insulating layer 30 may extend from the edge portion of the package substrate 20 onto the edge portion of the fourth semiconductor chip 10d disposed at the uppermost level via the edge portions of the first, second, and third semiconductor chips 10a, 10b, and 10c therebetween. The insulating layer 30 may include a polymer layer 31 and metal-containing particles 32 dispersed in the polymer layer 31. The polymer layer 31 may include at least one of various materials. For example, the polymer layer 31 may include epoxy mold compound or parylene. The metal-containing particles 32 may be metal particles being coated by metal oxide, metal nitride, metal carbide, metal sulfide, or insulating material. The metal included in the metal-containing particle 32 may be aluminum, magnesium, iron, manganese, copper, chromium, cobalt, and/or nickel.

The insulating layer 30 includes first holes H1 respectively exposing portions of the chip connection terminals 3a and 3b and second holes H2 respectively exposing portions of the substrate connection terminals 22a and 22b. Additionally, the insulating layer 30 includes a top surface 30us and a stepped recessed region R. The recessed region R may be formed to have a line shape connecting the first holes H1 and the second holes H2 to each other. Surfaces of sidewalls 30rs and bottoms 30rb of the recessed region R and inner sidewalls 30rh of the holes H1 and H2 have surface roughness (a dotted line in FIG. 2 shows the surfaces having the surface roughness). In other words, the surfaces of the sidewalls 30rs and the bottoms 30rb of the recessed region R and the inner sidewalls 30rh of the holes H1 and H2 are not smooth but indented in a concave-convex shape. The surface roughness of the sidewalls 30rs and the bottoms 30rb of the recessed region R and the inner sidewalls 30rh of the holes H1 and H2 is greater than that of the top surface 30us of the insulating layer 30.

Interconnections 40a and 40b are disposed in the recessed region R and the holes H1 and H2. The interconnections 40a and 40b may be protruded above the top surface 30us of the insulating layer 30. The interconnections 40a and 40b may include at least a copper layer formed by an electroless plating method. The interconnections 40a and 40b may further include a nickel/lead layer disposed on the copper layer. The interconnections 40a and 40b include first interconnections 40a and second interconnections 40b. Each of the first interconnections 40a may connect one of the first substrate connection terminals 22a to the first chip connection terminals 3a of the semiconductor chips 10a, 10b, 10c, and 10d corresponding thereto. The second interconnections 40b includes a first chip selection interconnection 40ba, a second chip selection interconnection 40bb, a third chip selection interconnection 40bc, and a fourth chip selection interconnection 40bd. The first chip selection interconnection 40ba connects the first chip enable substrate pin 22ba to the first chip enable pin 3ba. The second chip selection interconnection 40bb connects the second chip enable substrate pin 22bb to the second chip enable pin 3bb. The third chip selection interconnection 40bc connects the third chip enable substrate pin 22bc to the third chip enable pin 3bc. The fourth chip selection interconnection 40bd connects the fourth chip enable substrate pin 22bd to the fourth chip enable pin 3bd. The semiconductor chips 10a, 10b, 10c, and 10d and the package substrate 20 may be covered by a mold layer 50.

In the semiconductor package 100, since the surfaces of the sidewalls 30rs and the bottoms 30rb of the recessed region R and the inner sidewalls 30rh of the holes H1 and H2 have the surface roughness, it is possible to improve and adhesion force between the interconnections 40a and 40b and the insulating layer 30. Additionally, the insulating layer 30 may extend from the edge portion of the package substrate 20 onto the edge portion of the fourth semiconductor chip 10d disposed at the uppermost level via the edge portions of the first, second, and third semiconductor chips 10a, 10b, and 10c therebetween. In other words, the insulating layer 30 may continuously cover the edge portions of the semiconductor chips 10a, 10b, 10c, and 10d and the package substrate 20 without cutting, thereby protecting those. Thus, reliability of the semiconductor package 100 may be improved. Moreover, since the interconnections 40a and 40b are disposed on the insulating layer 30, problems caused by a wire sweeping in a wire bonding method can be solved and the degree of freedom of an interconnection can increase. Furthermore, since the wire is not used in the semiconductor package 100, the semiconductor package 100 may require the gold used as the wire to be economical.

A seed layer, which is formed of the same metal as the metal in the metal-containing particle 32, may be disposed between the insulating layer 30 and the interconnections 40a and 40b. However, the size of each of the metal-containing particles 32 may be very small (e.g. almost the size of a metal atom).

Figure 4:
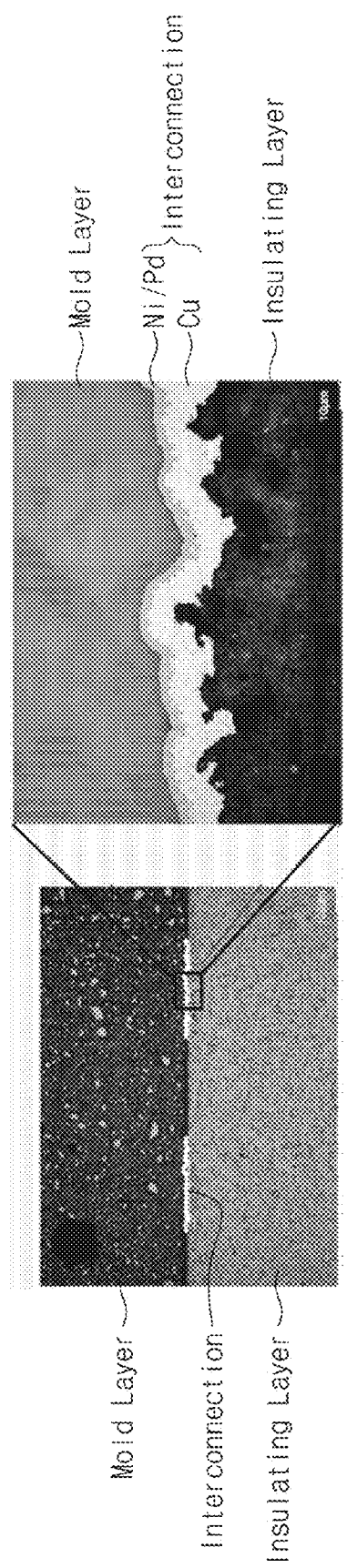
FIG. 4 is an enlarged cross-sectional photograph showing a portion of a semiconductor package manufactured according to some example embodiments.

FIG. 4 is an enlarged cross-sectional photograph showing a portion of a semiconductor package manufactured according to some example embodiments. Referring to FIG. 4, it can be confirmed that the surface of the insulating layer is very rough. It may be difficult to distinguish the seed layer in FIG. 4. Accordingly, the seed layer is omitted in FIGS. 3A and 3B.

Figure 13A:
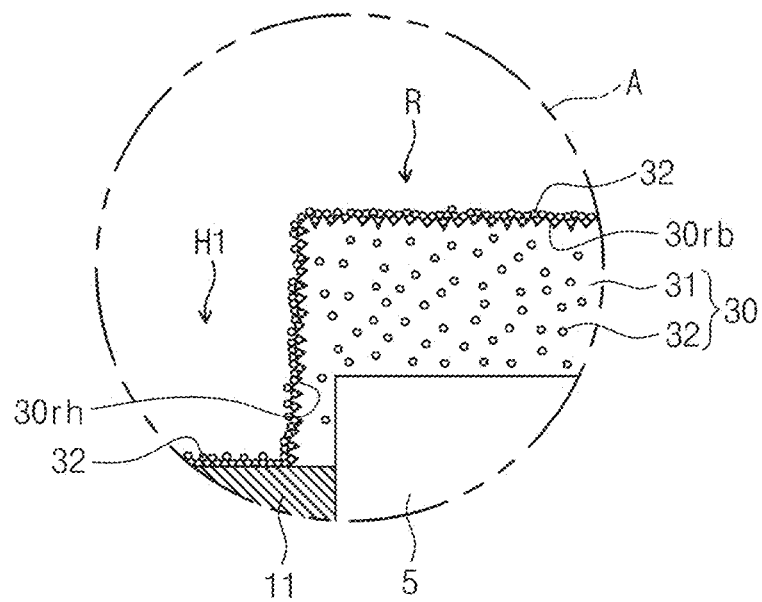
FIGS. 13A and 13B are enlarged cross-sectional views of a portion 'A' and a portion 'B' of FIG. 12, respectively.
Figure 13B:
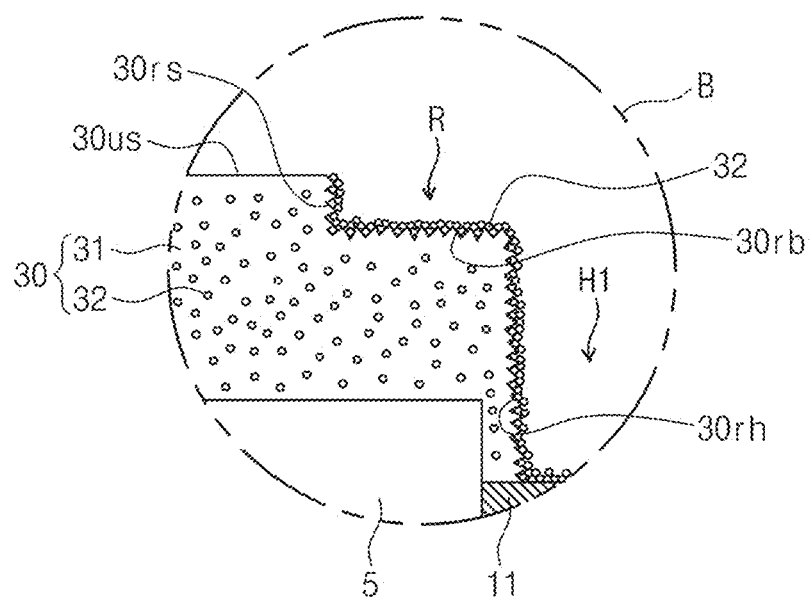

FIGS. 5 through 12 show a method of forming a semiconductor package having the cross-sectional view of FIG. 2. FIGS. 13A and 13B are enlarged cross-sectional views of a portion 'A' and a portion 'B' of FIG. 12, respectively.

Referring to FIG. 5, transistors, interconnections and interlayer insulating layers may be formed on a wafer to form a chip body 1. The chip body 1 includes a first surface 1a and a second surface 1b opposite to each other. Chip connection terminals 3a and 3b may be formed on the first surface 1a. A protection layer 5, which includes openings 7 respectively exposing the chip connection terminals 3a and 3b, may be formed on the first surface 1a. The chip connection terminals 3a and 3b may be formed of an aluminum layer.

Referring to FIG. 6, a grind process may be performed to remove a portion of the wafer adjacent to the second surface 1b of the chip body 1. Thus, a thickness of the chip body 1 may become smaller.

Referring to FIG. 7, an adhesion layer 9 is formed on the second surface 1b of the chip body 1. And then a wafer sawing process may be performed to divide the wafer into chips. Thus, semiconductor chips 10a, 10b, 10c, and 10d may be formed.

Referring to FIG. 8, the semiconductor chips 10a, 10b, 10c, and 10d are stacked on a package substrate 20. The package substrate 20 may correspond to a strip level or panel level substrate, or a unit package substrate formed by cutting it. Substrate connection terminals 22a and 22b are disposed on the package substrate 20. The substrate connection terminals 22a and 22b may include at least one selected from a group including gold, nickel, and lead. Edge portions of the semiconductor chips 10a, 10b, 10c, and 10d may be stacked to constitute a stepped structure, so that the chip connection terminals 3a and 3b and the substrate connection terminals 22a and 22b are exposed. The semiconductor chips 10a, 10b, 10c and 10d and the package substrate 20 can be adhered to each other by the adhesion layers 9.

Referring to FIG. 9, an electroless plating method is performed to form laser blocking patterns 11 on the chip connection terminals 3a and 3b exposed by the openings 7, respectively. For example, the laser blocking patterns 11 may be formed of at least one selected from a group including gold, nickel, and lead. For the formation of the laser blocking patterns 11, the package substrate 20 may be soaked in a batch type reaction bath for the electroless plating. In a first case, the laser blocking patterns 11 may be formed before the wafer sawing process is performed.

The electroless plating method may be performed in strip level or panel level. In other words, the package substrate 20 may correspond to a package substrate of the strip or panel level. Alternatively, even though the package substrate 20 is the unit package substrate, a plurality of the unit package substrates may be combined with each other in the strip or panel level and then the electroless plating method may be performed. In a second case, the laser blocking patterns 11 may be formed in the strip or panel level after the semiconductor chips 10a, 10b, 10c, and 10d are stacked on the package substrate 20. Here, yield obtained by the second case may be greater than yield obtained by the first case. If the substrate connection terminals 22a and 22b are formed of gold, the laser blocking patterns 11 may not be formed on the substrate connection terminals 22a and 22b.

Referring to FIG. 10, an insulating layer 30 is formed to cover the edge portions of the semiconductor chips 10a, 10b, 10c, and 10d and the package substrate 20. The insulating layer 30 may be widely formed to fully cover the edge portions of the semiconductor chips 10a, 10b, 10c, and 10d and the package substrate 20. In the present embodiment, the insulating layer 30 may be formed by an inkjetting method or a spray coating method. When the insulating layer 30 is formed by the inkjetting method or the spray coating method, it is easy to selectively form the insulating layer 30 may be easily on a desired region. The insulating layer 30 may include a polymer layer and metal-containing particles dispersed therein. For example, the polymer layer may be an epoxy mold compound layer or a parylene layer. The metal-containing particles may be metal particles being coated by metal oxide, metal nitride, metal carbide, metal sulfide, or insulating material. The metal included in the metal-containing particles may be aluminum, magnesium, iron, manganese, copper, chromium, cobalt, and/or nickel. The insulating layer 30 may include a solvent dissolving the macromolecule material for forming the insulating layer 30 by the inkjetting method or the spray coating method. Additionally, a drying process for evaporating the solvent may be performed.

Figure 11:
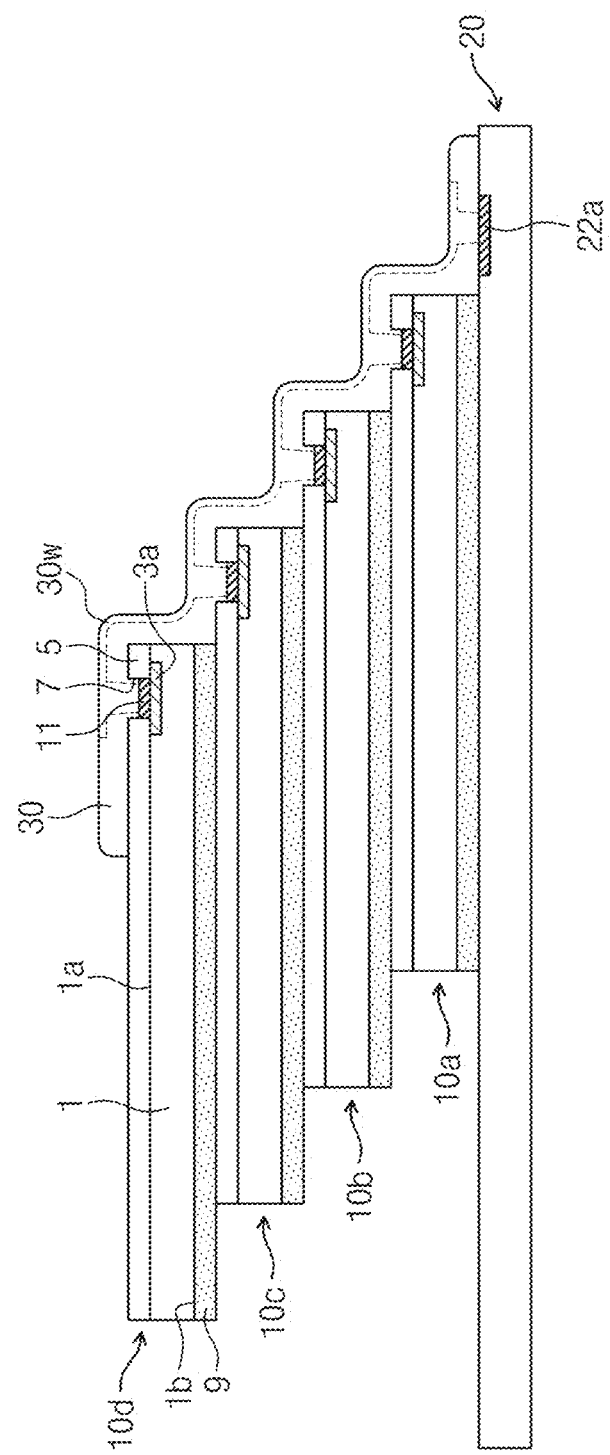

Referring to FIGS. 11, 12, 13A, and 13B, a laser is irradiated to activate a surface of the insulating layer 30 and simultaneously to form holes H1 and H2 exposing the chip connection terminals 3a and 3b and the substrate connection terminals 22a and 22b. The polymer layer 31 included in the insulating layer 30 may burn to be removed in the process activating the surface of the insulating layer 30 and forming the holes H1 and H2. Thus, a portion 30w of an upper portion of the insulating layer 30 of FIG. 11 is removed. For example, the laser may be an infrared laser (wavelength: about 1064 nanometers or nm). The laser may be irradiated with an intensity of about 5 watts (W) or less, and the laser may be irradiated to provide a temperature capable of burning the polymer layer 31 to the insulating layer 30. If the polymer layer 31 is formed of epoxy mold compound, the laser may be irradiated to provide a temperature within a range of about 300 degrees Celsius to about 500 degrees Celsius to the polymer layer 31. The polymer layer 31 is burned to be removed by the irradiation of the laser, thereby forming a recessed region R and the holes H1 and H2. The recessed region R is formed at the upper portion of the insulating layer 30. Sidewalls 30rs and bottoms 30rb of the recessed region R and inner sidewalls of the holes H1 and H2 are formed to have surface roughness. And, the metal-containing particles 32 not burned by the laser remain on the sidewalls 30rs and the bottoms 30rb of the recessed region R and the inner sidewalls and bottoms of the holes H1 and H2. A bind ring between a metal and non-metal atom (e.g. oxygen, nitrogen, carbon, or sulfur atom) in the metal-containing particles 32 may be broken by the laser. Here, a compound including the non-metal atom may be evaporated and the metal may remain to be exposed. Alternatively, if the metal-containing particles 32 are metal particles coated by an insulating material, the metal-containing particles 32 coated by the insulating material may remain. The process partially burning the polymer layer 31 to be removed by the laser and exposing the metal-containing particles 32 may be defined as activation of the insulating layer 30. The remaining metal-containing particles 32 may be used as a seed layer for subsequent interconnections 40a and 40b formed by an electroless plating method.

Referring to FIGS. 2, 3A and 3B, in the case that the metal-containing particles 32 are exposed, the electroless plating method is performed to form interconnections 40a and 40b. For the formation of the interconnections 40a and 40b, the package substrate 20 may be soaked in a batch type reaction bath for the electroless plating. The electroless plating method may be performed in strip level or panel level. In other words, the package substrate 20 may correspond to a package substrate of the strip or panel level. Alternatively, even though the package substrate 20 is the unit package substrate, a plurality of the unit package substrates may be combined with each other in the strip or panel level and then the electroless plating method may be performed. Thus, it is possible to perform the strip/panel level batch process, thereby increasing yield and maximizing productivity.

A pre-treatment process may be performed before the electroless plating method is performed. The insulating material of the metal-containing particles 32 may be removed in the pre-treatment process. If the metal-containing particles 32 are metal particles coated by an oxide layer, the oxide layer of the metal-containing particles 32 may be removed using hydrofluoric acid (HF). Thus, the insulating material of the metal-containing particles 32 may be removed and the metal of the metal-containing particles 32 may remain to form a seed layer for the electroless plating method. And then the electroless plating method is performed to selectively form the interconnections 40a and 40b in the recessed region R and the holes H1 and H2. Subsequently, a mold layer 50 may be formed to realize the semiconductor package 100 of FIG. 2. If the package substrate 20 is the strip/panel level, a subsequent process dividing the package substrate 20 into unit packages may further be performed.

A wire bonding process may require a long process time for bonding the wire. However, according to some example embodiments, the wire bonding process is not required and the interconnections 40a and 40b can be formed by the electroless plating method. Thus, it is possible to perform the strip/panel-level batch process, the interconnections 40a and 40b are formed in shorter time than the wire bonding process, and productivity of the semiconductor package 100 may be maximized.

Second Embodiment

Figure 14:
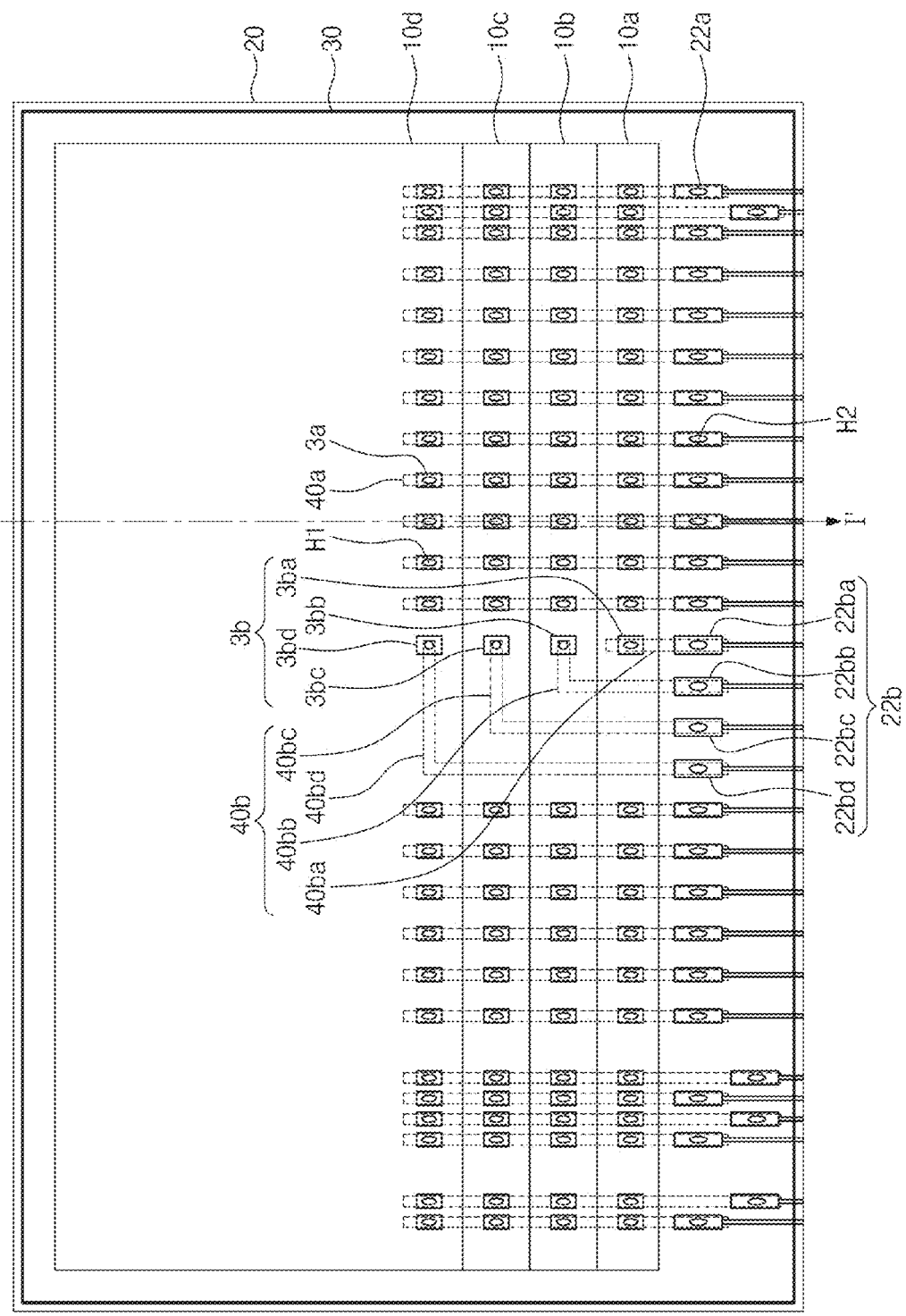
FIG. 14 is a layout illustrating a semiconductor package according to some example embodiments.
Figure 15:
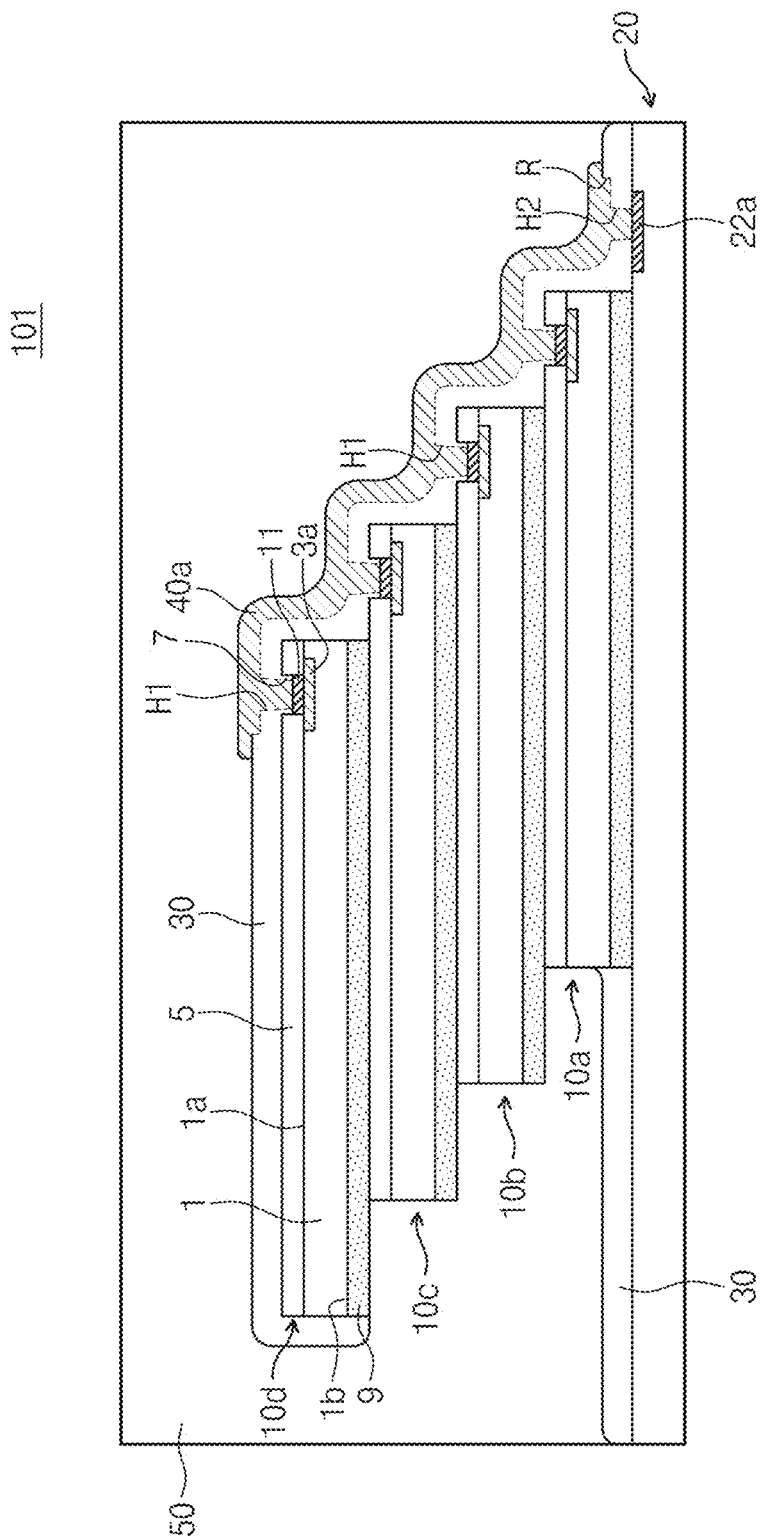
FIG. 15 is a cross-sectional view taken along a line I-I' of FIG. 14.

FIG. 14 is a layout illustrating a semiconductor package according to some example embodiments. FIG. 15 is a cross-sectional view taken along a line I-I' of FIG. 14.

Referring to FIGS. 14 and 15, an insulating layer 30 may be formed by a spin coating method in a semiconductor package 101 according to the present embodiment. Since the insulating layer 30 is formed by the spin coating method, the insulating layer 30 may cover all sidewalls of the semiconductor chips 10a, 10b, 10c, and 10d and an entire top surface of the fourth semiconductor substrate 10d located at the uppermost level. Additionally, the insulating layer 30 may cover a top surface of the package substrate 20 under the fourth semiconductor chip 10d. As an area of the insulating layer 30 covering the semiconductor chips 10a, 10b, 10c, and 10d and package substrate 20 become wider, the semiconductor chips 10a, 10b, 10c, and 10d and package substrate 20 can be increasingly protected. For example, when the package substrate 20 is soaked in an electrolytic bath in the electroless plating process for the formation of the interconnections, the insulating layer 30 may protect the semiconductor chips 10a, 10b, 10c, and 10d and the package substrate 20 from a chemical attack caused by an electrolyte. Formation methods and/or structures of other components in the semiconductor packages 101 may be the same as or similar to those of the semiconductor packages 100 according to the first example embodiment.

Third Embodiment

Figure 16:
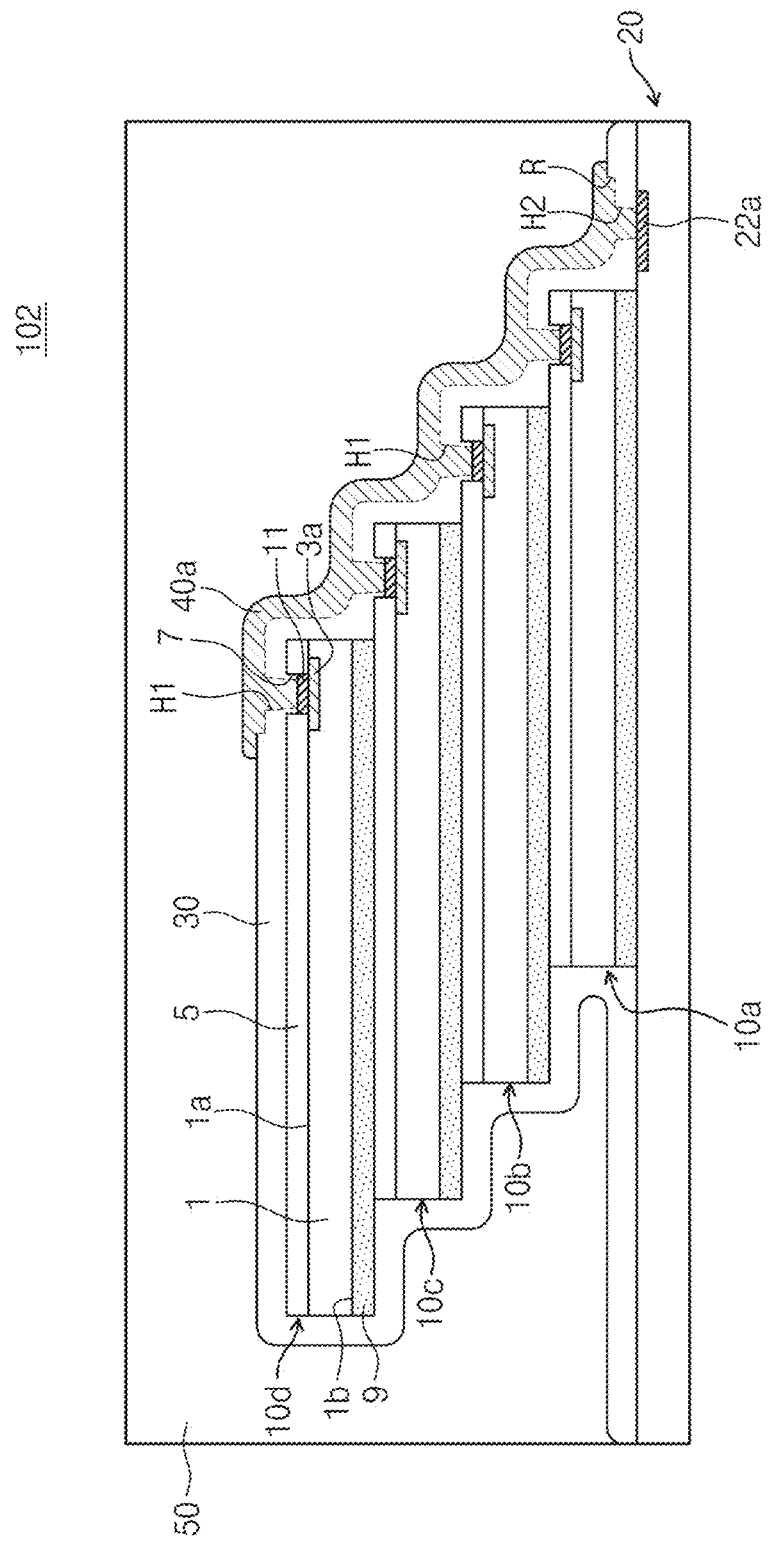
FIG. 16 is a cross-sectional view illustrating a semiconductor package according to some example embodiments.

FIG. 16 is a cross-sectional view illustrating a semiconductor package according to some example embodiments.

Referring to FIG. 16, in a semiconductor package 102 according to the present embodiment, an insulating layer 30 may conformally cover sidewalls, top surfaces, and bottom surfaces of the semiconductor chips 10a, 10b, 10c, and 10d and the top surface of the package substrate 20. The insulating layer 30 may be formed by a spin coating method. However, it is preferable that the insulating layer 30 may be formed by a chemical vapor deposition (CVD) process. Here, the polymer layer included in the insulating layer 30 may be formed of parylene. Since the insulating layer 30 covers all exposed surfaces of the semiconductor chips 10a, 10b, 10c, and 10d and the package substrate 20, the insulating layer may stably protect the semiconductor chips 10a, 10b, 10c, and 10d and the package substrate 20 from the chemical attack caused by the electrolyte in the electroless plating process. Formation methods and/or structures of other components in the semiconductor packages 102 may be the same as or similar to those of the semiconductor packages 100 according to the first example embodiment.

Fourth Embodiment

Figure 17:
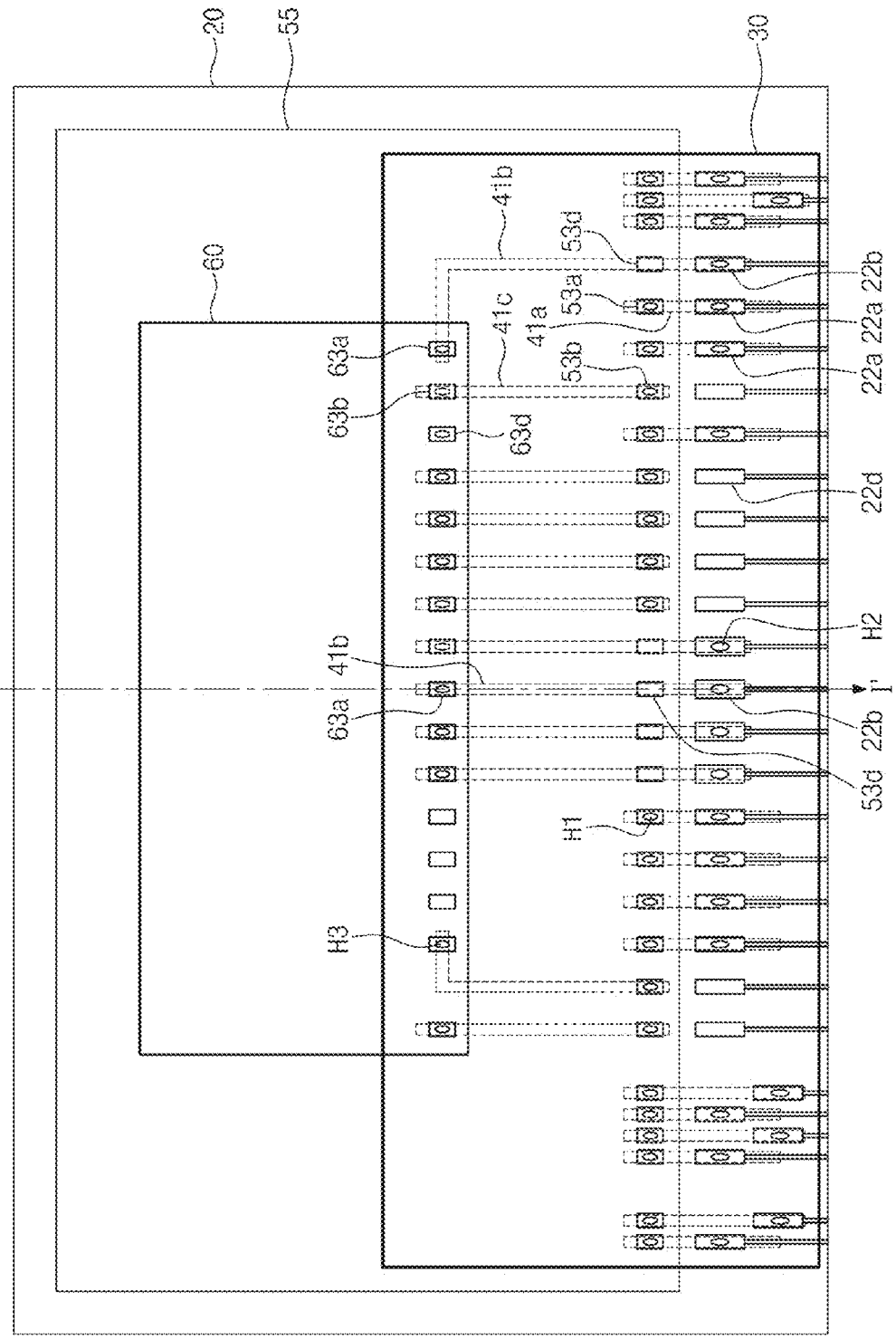
FIG. 17 is a layout illustrating a semiconductor package according to some example embodiments.
Figure 18:
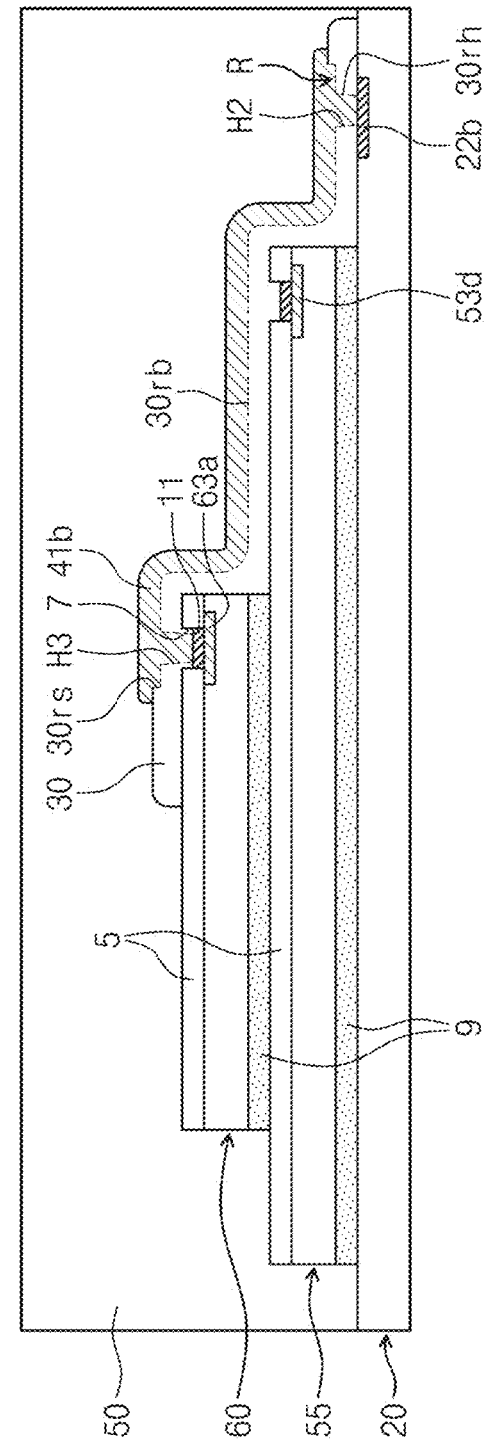
FIG. 18 is a cross-sectional view taken along a line I-I' of FIG. 17.

FIG. 17 is a layout illustrating a semiconductor package according to some example embodiments. FIG. 18 is a cross-sectional view taken along a line I-I' of FIG. 17.

Referring to FIGS. 17 and 18, semiconductor chips of different kinds from each other may be stacked in a semiconductor package 103 according to the present embodiment. A first semiconductor chip 55 and a second semiconductor chip 60 may be stacked on the package substrate 20. A size of the second semiconductor chip 60 may be less than that of the first semiconductor chip 55. The first semiconductor chip 55 may have a different kind from that of the second semiconductor chip 60. For example, the first semiconductor chip 55 may be a memory chip and the second semiconductor chip 60 may be a logic chip. Alternatively, the first semiconductor chip 55 may be a logic chip and the second semiconductor chip 60 may be a memory chip. The first semiconductor chip 55 may include a first chip connection terminal 53a, a second chip connection terminal 53b, and a first dummy chip connection terminal 53d. The second semiconductor chip 60 may include a third chip connection terminal 63a, a fourth chip connection terminal 63b, and a second dummy chip connection terminal 63d. The package substrate 20 may include a first substrate connection terminal 22a, a second substrate connection terminal 22b, and a dummy substrate connection terminal 22d. Each of the first semiconductor chip 55 and the second semiconductor chip 60 may include a protection layer 5 having openings 7 exposing the chip connection terminals 53a and 53b, or 63a and 63b, and the dummy chip connection terminal 53d or 63d, respectively. A laser blocking pattern 11 is disposed in each of the opening 7. An adhesion layer 9 is disposed a surface of each of the first and second semiconductor chips 55 and 60 which is opposite to the protection layer 5.

An insulating layer 30 may cover edge portions of the semiconductor chips 55 and 60 and an edge portion of the package substrate 20. As described in the first embodiment, the insulating layer 30 includes a recessed region R and holes H1, H2, and H3. The holes H1, H2, and H3 may include a first hole H1 exposing the laser blocking pattern 11 on each of the first and second chip connection terminals 53a and 53b, a second hole H2 exposing each of the substrate connection terminals 22a and 22b, and a third hole H3 exposing the laser blocking pattern 11 on each of the third and fourth chip connection terminals 63a and 63b. Surfaces of sidewalls 30rs and bottoms 30rb of the recessed region R and inner sidewalls 30rh of the holes H1, H2, and H3 have surface roughness. Interconnections 41a, 41b, and 41c are disposed in the recessed region R and the holes H1, H2, and H3 to connect the chip connection terminals 53a, 53b, 63a, and 63b to the substrate connection terminals 22a and 22b. The interconnections 41a, 41b, and 41c include a first interconnection 41a, a second interconnection 41b, and a third interconnection 41c. The first interconnection 41a connects the first chip connection terminal 53a to the first substrate connection terminal 22a. The second interconnection 41b connects the third chip connection terminal 63a to the second substrate connection terminal 22b. The third interconnection 41c connects the second chip connection terminal 53b to the fourth chip connection terminal 63b. As illustrated in FIG. 18, the second interconnection 41b is disposed on the insulating layer 30 to connect the second substrate connection terminal 22b to the third chip connection terminal 63a through the second hole H2 and the third hole H3. At this time, the first dummy chip connection terminal 53d is disposed under the second interconnection 41b. However, the first dummy chip connection terminal 53d is not connected to the second interconnection 41b by the insulating layer 30. Thus, when the chips of different kinds from each other are stacked, the degree of freedom of an interconnection may increase.

Fifth Embodiment

Figure 19:
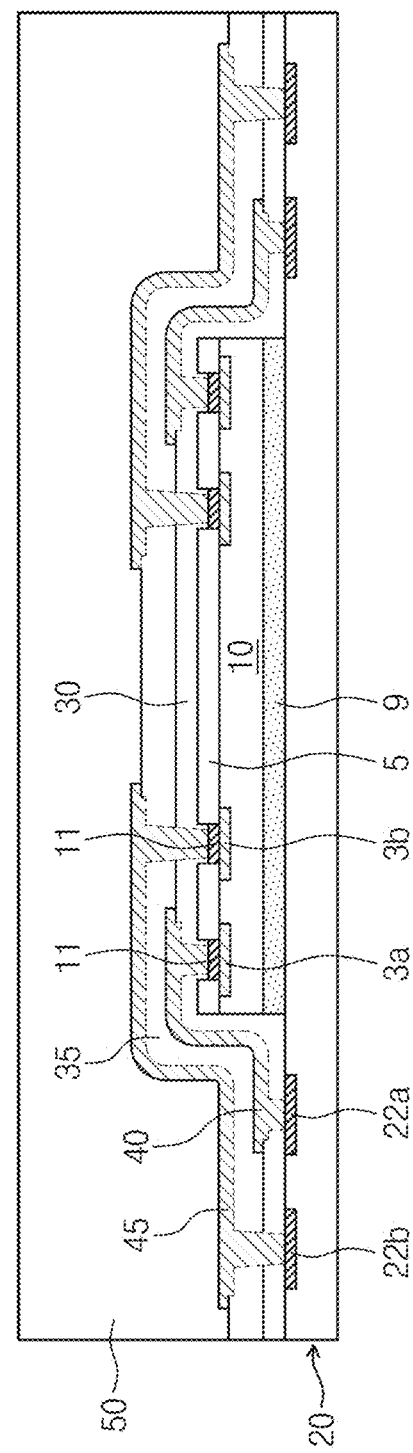
FIG. 19 is a cross-sectional view illustrating a semiconductor package according to some example embodiments.

FIG. 19 is a cross-sectional view illustrating a semiconductor package according to some example embodiments.

Referring to FIG. 19, a single semiconductor chip 10 may be mounted on a package substrate 20 in a semiconductor package 104 according to the present embodiment. The package substrate 20 may have a first substrate connection terminal 22a and a second substrate connection terminal 22b being laterally disposed side by side. A first chip connection terminal 3a and a second chip connection terminal 3b may be laterally disposed on a top surface of the semiconductor chip 10. A first insulating layer 30 may cover the top surface and sidewalls of the semiconductor chip 10 and a top surface of the package substrate 20. A first interconnection 40 is disposed on the first insulating layer 30. The first interconnection 40 penetrates the first insulating layer 30 to connect the first chip connection terminal 3a to the first substrate connection terminal 22a. A second insulating layer 35 may covers the first interconnection 40 and the first insulating layer 30. A second interconnection 45 is disposed on the second insulating layer 35. The second interconnection 45 penetrates the second insulating layer 35 and the first insulating layer 30 to connect the second substrate connection terminal 22b to the second chip connection terminal 3b. Each of the first and second insulating layers 30 and 35 includes the same polymer layer and the same metal-containing particles dispersed therein as those of the insulating layer 30 described in the first embodiment. The first interconnection 40 and the second interconnection 45 may be formed of an electroless plating method. A seed layer being formed of the same metal as the metal constituting the metal-containing particles may be disposed between the first interconnection 40 and the first insulating layer 30, between the second interconnection 45 and the second insulating layer 35, and between the second interconnection 45 and the first insulating layer 30. The first interconnection 40 and the second interconnection 45 may be vertically overlapped with each other. However, the first interconnection 40 and the second interconnection 45 are electrically insulated from each other by the second insulating layer 35 therebetween. Accordingly, the degree of freedom of an interconnection may increase. Formation methods and/or structures of other components in the semiconductor packages 104 may be the same as or similar to those of the semiconductor packages 100 according to the first example embodiment.

Sixth Embodiment

Figure 20:
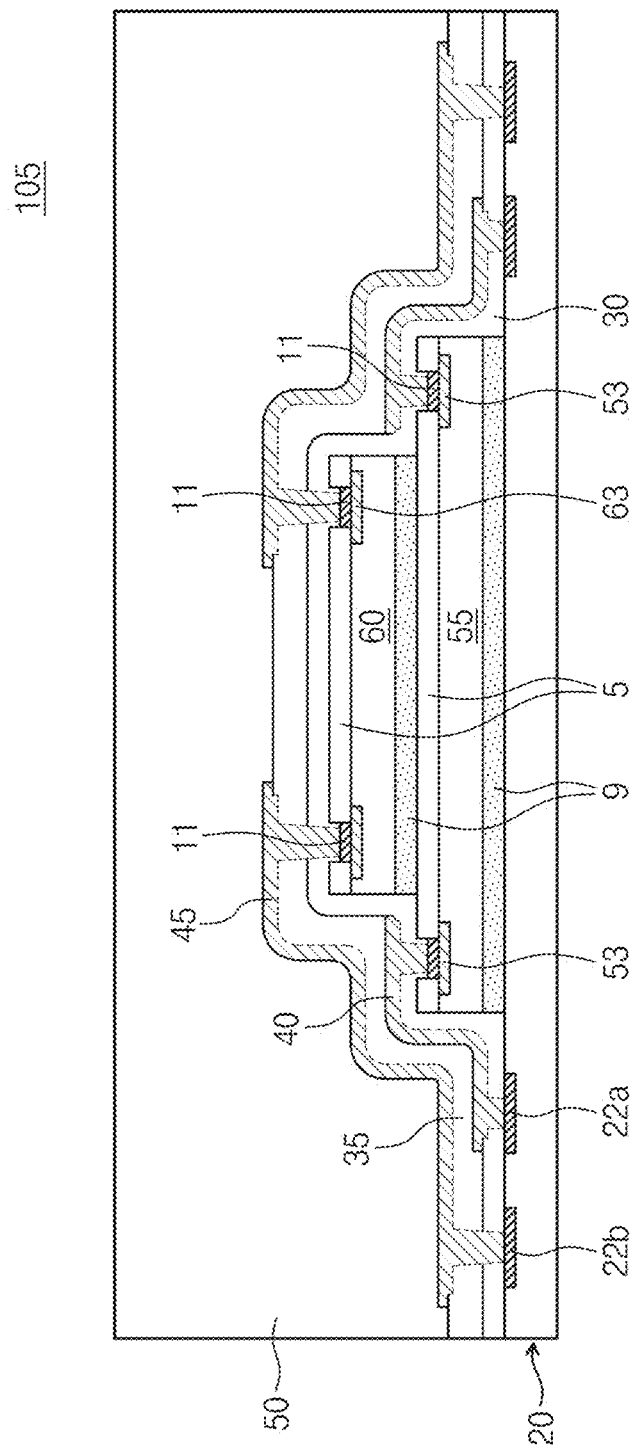
FIG. 20 is a cross-sectional view illustrating a semiconductor package according to some example embodiments.

FIG. 20 is a cross-sectional view illustrating a semiconductor package according to some example embodiments.

Referring to FIG. 20, a first semiconductor chip 55 and a second semiconductor chip 60, which are different from each other, may be stacked to be mounted on the package substrate 20 in a semiconductor package 105 according to the present embodiment. The first semiconductor chip 55 may be wider than the second semiconductor chip 60 and may be disposed under the second semiconductor chip 60. The package substrate 20 may have a first substrate connection terminal 22a and a second substrate connection terminal 22b being laterally disposed side by side. The first semiconductor chip 55 includes a first chip connection terminal 53. The second semiconductor chip 60 includes a second chip connection terminal 63. A first insulating layer 30 may conformally cover a top surface and a sidewall of the second semiconductor chip 60, a top surface of a sidewall of the first semiconductor chip 55, and a top surface of the package substrate 20. A first interconnection 40 is disposed on the first insulating layer 30 and penetrates the first insulating layer 30 to connect the first substrate connection terminal 22a to the first chip connection terminal 53. A second insulating layer 35 may cover the first interconnection 40 and the first insulating layer 30. A second interconnection 45 is disposed on the second insulating layer 35 and penetrates the second and first insulating layers 35 and 30 to connect the second substrate connection terminal 22b to the second chip connection terminal 63. The package substrate 20 may have the first substrate connection terminal 22a and the second substrate connection terminal 22b being laterally disposed side by side. Accordingly, the degree of freedom of an interconnection may increase. Formation methods and/or structures of other components in the semiconductor packages 105 may be the same as or similar to those of the semiconductor packages 100 according to the first example embodiment.

Seventh Embodiment

Figure 21:
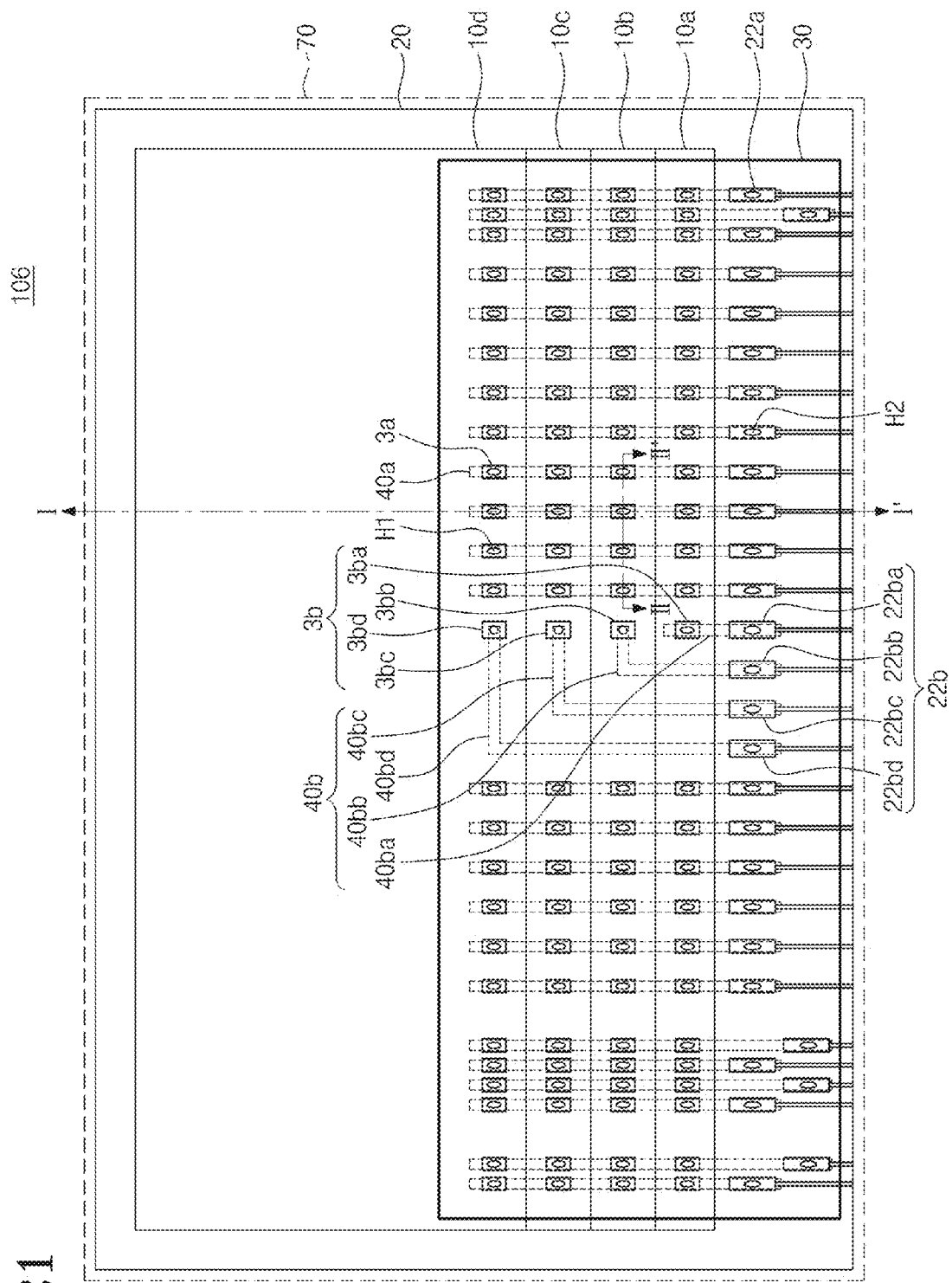
FIG. 21 is a plan view illustrating a semiconductor package according to some example embodiments.
Figure 22B:
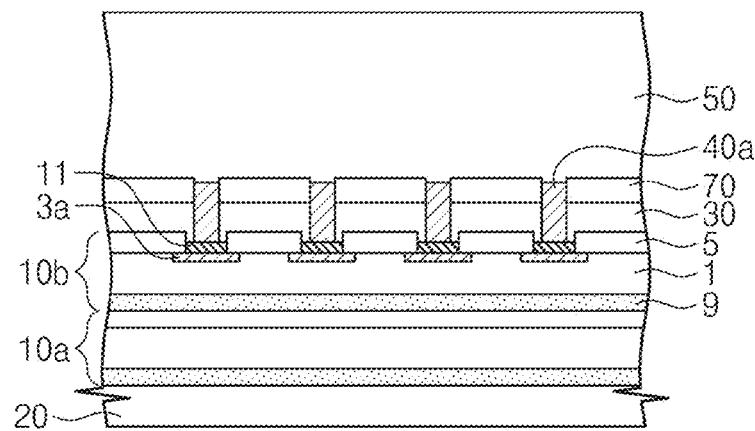
Figure 23:
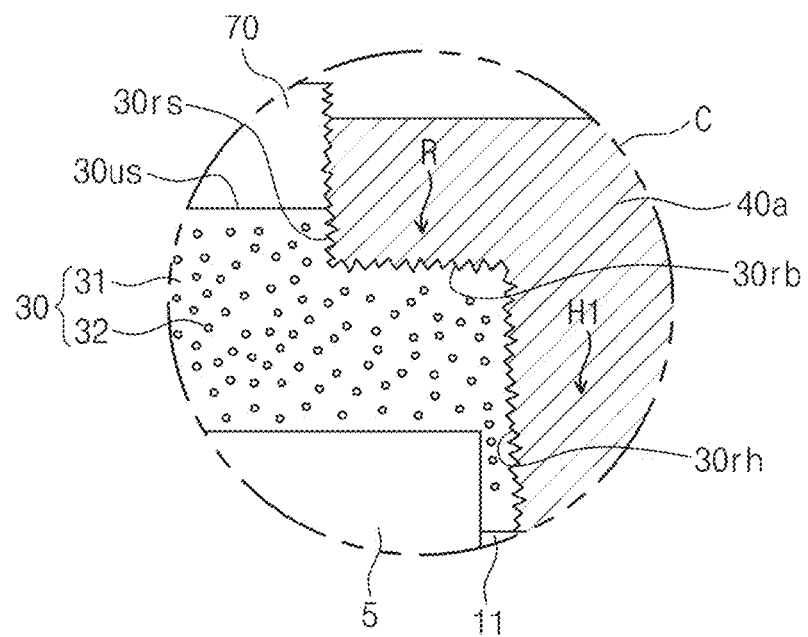
FIG. 23 is an enlarged view of a portion 'C' of FIG. 22A.

FIG. 21 is a plan view illustrating a semiconductor package according to some example embodiments. FIGS. 22A and 22B are cross-sectional views taken along a line I-I' and a line II-II' of FIG. 21, respectively. FIG. 23 is an enlarged view of a portion 'C' of FIG. 22A.

Referring to FIGS. 21, 22A, 22B, and 23, in a semiconductor package 106 according to the example embodiment, a second insulating layer 70 may be added in the semiconductor package 100 of FIG. 2. Here, the insulating layer 30 of the semiconductor package 100 of FIG. 2 is referred to as 'a first insulating layer 30'.

In detail, end portions of the semiconductor chips 10a, 10b, 10c, and 10d may be stacked on a substrate 20 to constitute the stepped structure. Chip connection terminals 3a and a laser blocking pattern 11 may be disposed on the end portions of the semiconductor chips 10a, 10b, 10c, and 10d. The end portions of the semiconductor chips 10a, 10b, 10c, and 10d are covered by the first insulating layer 30. The second insulating layer 70 covers a top surface of the substrate 20, top surfaces, sidewalls, and bottom surfaces of the semiconductor chips 10a, 10b, 10c, and 10d, and the first insulating layer 30. An interconnection 40a penetrates the second and first insulating layers 70 and 30, so that the interconnection 40a is in contact with the laser blocking pattern 11. The first insulating layer 30 includes a polymer layer 31 and metal-containing particles 32. The second insulating layer 70 does not include metal-containing particles 32. The second insulating layer 70 includes an insulating material. For example, the second insulating layer 70 may include at least one of parylene, teflon, and epoxy mold compound. The first insulating layer 30 may include a recessed region R and holes H1. A sidewall of the second insulating layer 70 is aligned with a sidewall of the recessed region R. A surface roughness of the sidewall of the second insulating layer 70 may be greater than a surface roughness of a top surface of the second insulating layer 70. A top surface of the interconnection 40a may have a height equal to, lower than, or higher than a top surface of the second insulating layer 70. Particularly, the top surface of the interconnection 40a may have a height equal to or lower than the top surface of the second insulating layer 70. As illustrated in FIG. 22B, a space between neighboring interconnections 40a may be filled with the first insulating layer 30 and the second insulating layer 70.

Formation methods and/or structures of other components in the semiconductor packages 106 may be the same as or similar to those of the semiconductor packages 100 according to the first embodiment.

Figure 24:
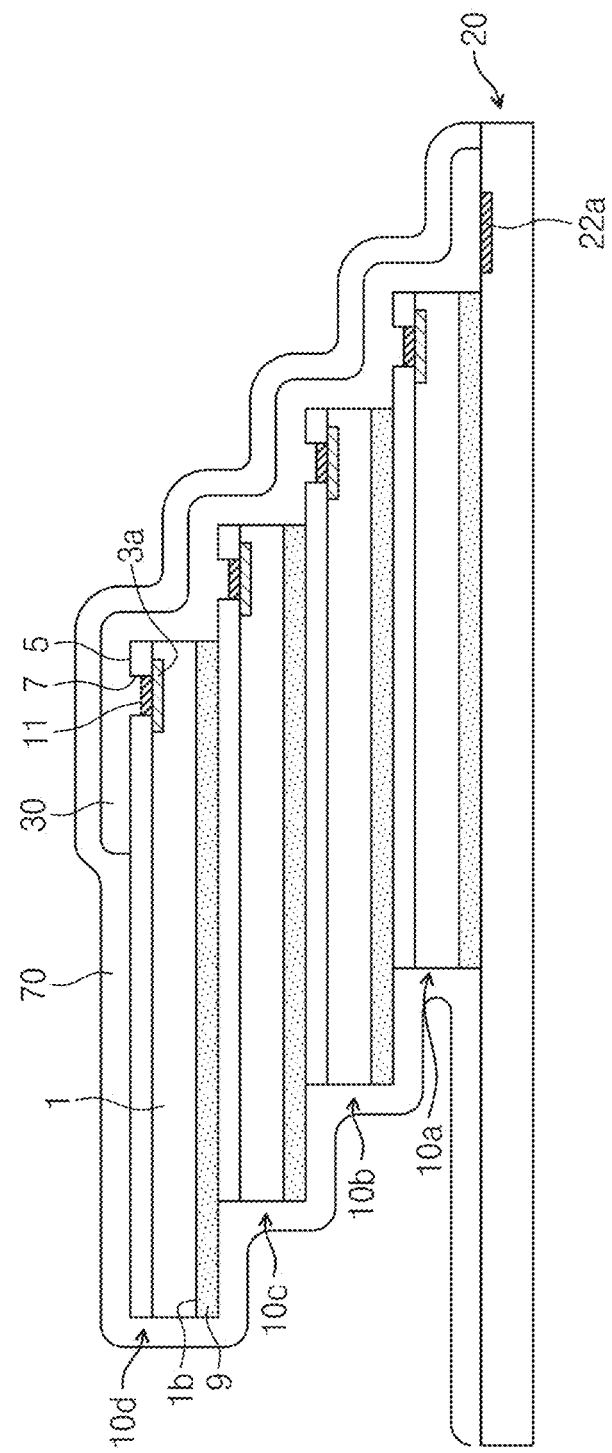
FIGS. 24 to 26 are cross-sectional views illustrating a method of forming a semiconductor package having a cross section of FIG. 22A.
Figure 25:
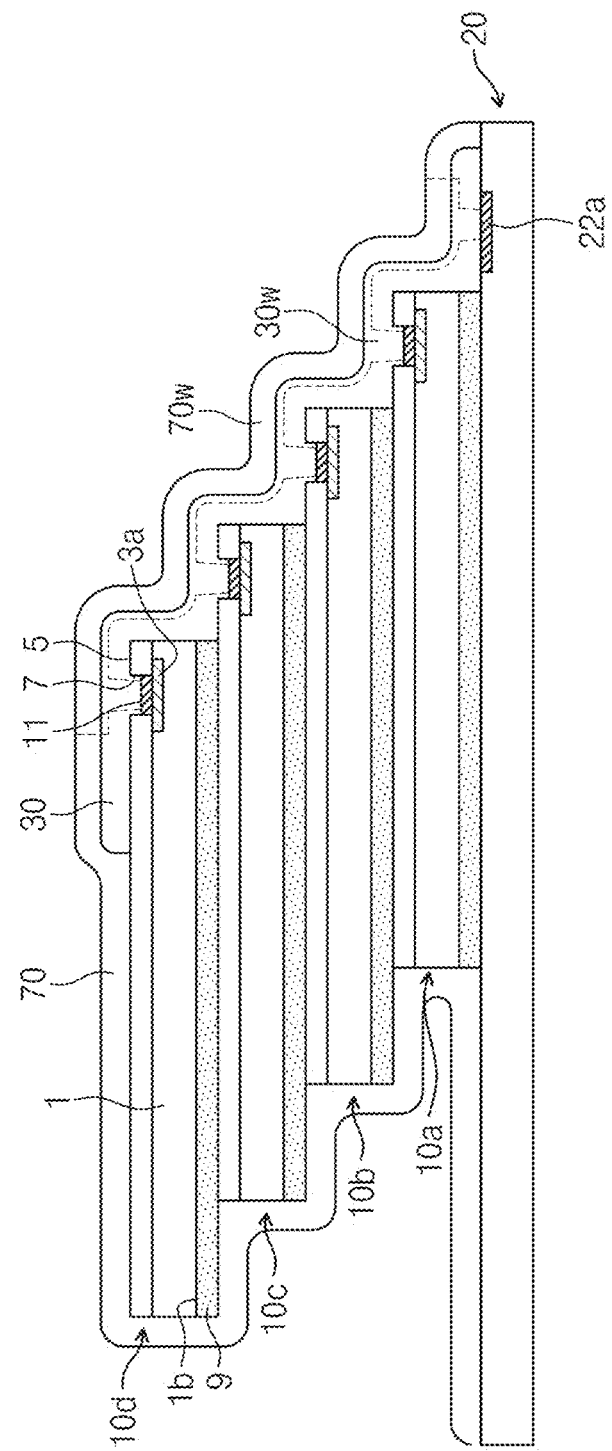
Figure 26:
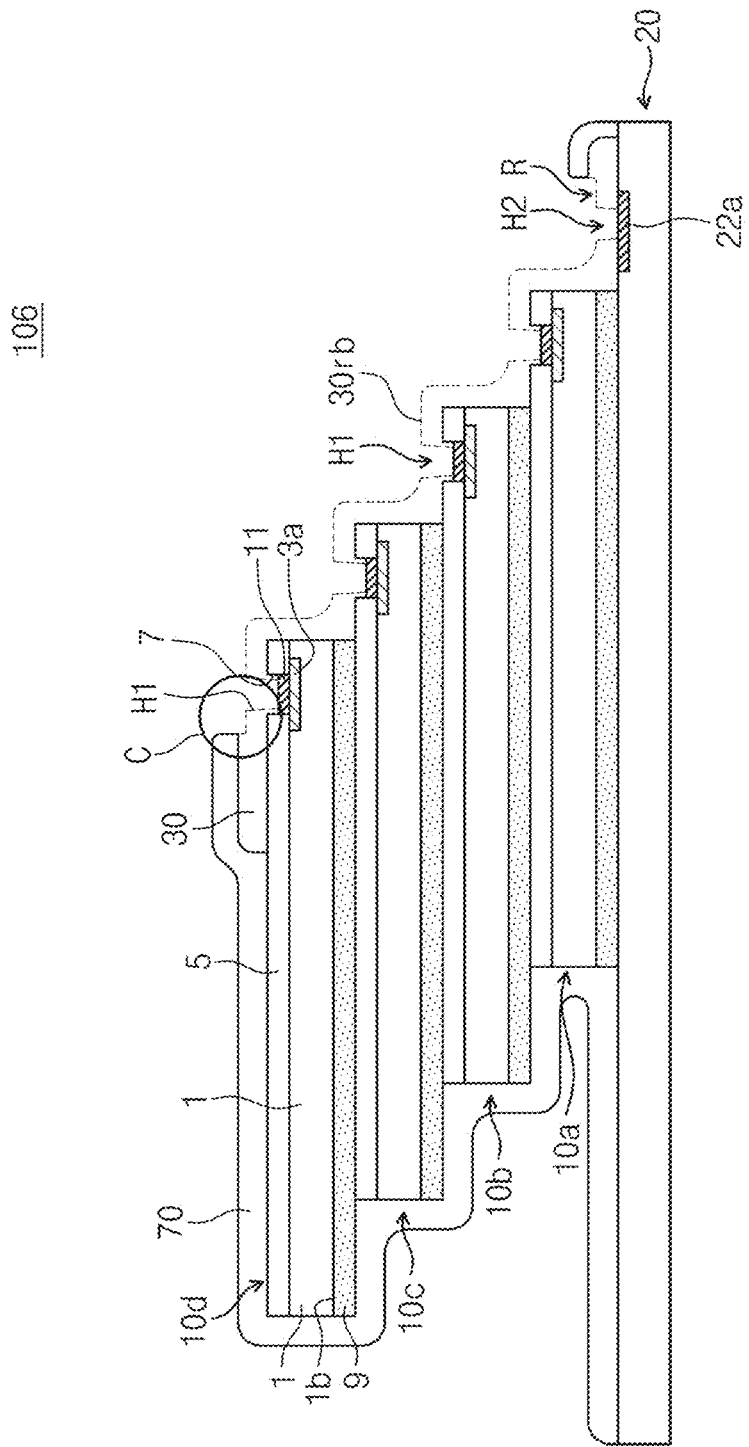
Figure 27:
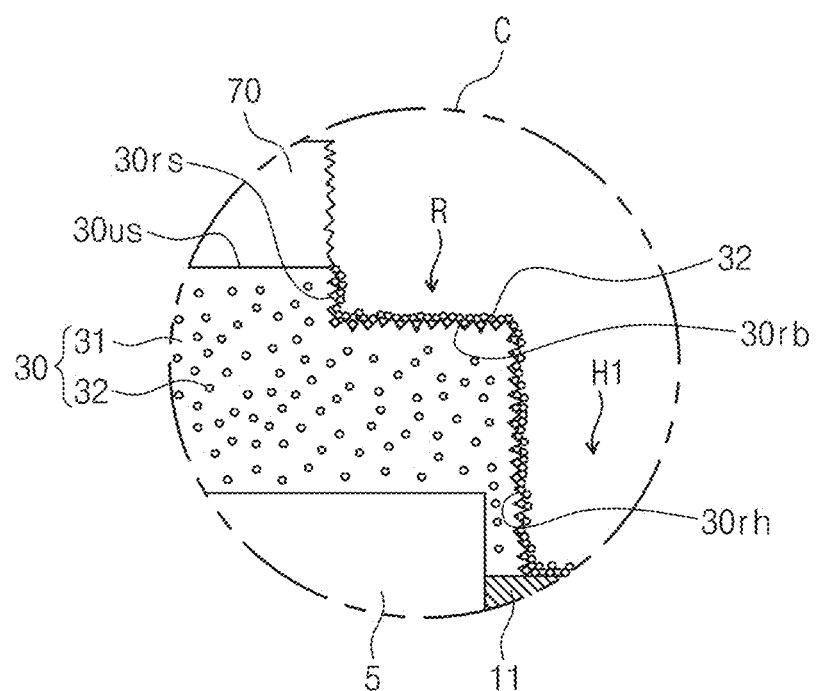
FIG. 27 is an enlarged view of a portion 'C' of FIG. 26.

FIGS. 24 to 26 are cross-sectional views illustrating a method of forming a semiconductor package having a cross section of FIG. 22A. FIG. 27 is an enlarged view of a portion 'C' of FIG. 26.

Referring to FIG. 24, a second insulating layer 70 is formed on the substrate 20 including the structure illustrated in FIG. 10. The second insulating layer 70 may be conformally formed. The second insulating layer 70 does not include metal-containing particles 32. The second insulating layer 70 may be formed of, for example, parylene, teflon, and epoxy mold compound. The second insulating layer 70 may be formed by at least one of various methods such as a CVD method, a spin coating method, a spray coating method, a dipping method.

Referring to FIGS. 25, 26, and 27, a laser is irradiated to remove a portion 70w of the second insulating layer 70 and a portion 30w of the first insulating layer 30. Thus, holes H1 and H2 are formed to expose the chip connection terminals 3a and 3b and substrate connection terminals 22a and 22b, and a surface of the first insulating layer 30 is activated. The laser may be an infrared laser (wavelength: about 1064 nm). The laser may be irradiated with an intensity of about 5 watts (W) or less, and the laser may be irradiated to provide a temperature capable of burning the second insulating layer 70 and a polymer layer 31. If the polymer layer 31 is formed of epoxy mold compound, the laser may be irradiated to provide a temperature within a range of about 300 degrees Celsius to about 500 degrees Celsius to the polymer layer 31. The polymer layer 31 is burned to be removed by the irradiation of the laser, thereby forming a recessed region R and the holes H1 and H2 at the upper portion of the first insulating layer 30. Here, a sidewall of the second insulating layer 70, sidewalls 30rs, and a bottom 30rb of the recessed region R, and sidewalls 30rh of the holes H1 and H2 are formed to have surface roughness. And, metal-containing particles 32 not burned by the laser remain on the sidewalls 30rs and the bottoms 30rb of the recessed region R and the inner sidewalls and bottoms of the holes H1 and H2. A bind ring between a metal atom and a non-metal atom (e.g. oxygen, nitrogen, carbon, or sulfur atom) in the metal-containing particles 32 may be broken by the laser. Here, a compound including the non-metal atom may be evaporated and the metal atom may remain to be exposed. Alternatively, if the metal-containing particles 32 are metal particles coated by an insulating material, the metal-containing particles 32 coated by the insulating material may remain. The process partially burning the polymer layer 31 to be removed by the laser and exposing the metal-containing particles 32 may be defined as activation of the first insulating layer 30. The remaining metal-containing particles 32 may be used as a seed layer for subsequent interconnections 40a and 40b formed by an electroless plating method. Since the second insulating layer 70 does not include the metal-containing particles 32, the metal-containing particles 32 do not exist on any surface of the second insulating layer 70.

Referring to FIGS. 21, 22A, and 22B again, as described in the first embodiment, an electroless plating method may be performed to form interconnections 40a and 40b. Here, the second insulating layer 70 covers the top surface of the substrate 20, the top surfaces, sidewalls and the bottom surface of the semiconductor chips 10a, 10b, 10c, and 10d, and the first insulating layer 30 except a region in which the interconnections 40a and 40b are formed. Thus, the second insulating layer 70 may protect the semiconductor chips 10a, 10b, 10c, and 10d and the substrate 20 from a chemical attack during the electroless plating method. Additionally, if the first insulating layer 30 is exposed without second insulating layer 70 during the electroless plating method, the metal-containing particles 32 may be exposed on a surface of another region (where the interconnections 40a and 40b are not formed) of the first insulating layer 30. When the metal-containing particles 32 are exposed, metal may be insignificantly extracted, and an undesired plating layer may be formed on the region in which the metal is extracted. However, in the present embodiment, the second insulating layer 70 covers the first insulating layer 30, such that the metal-containing particles 32 are not exposed. Thus, a bridge fail and/or a short fail may be prevented.

Other processes in the example embodiment may be the same as or similar to those of other example embodiments.

The semiconductor package techniques described above may be applied to semiconductor devices of various kinds and package modules including the same.

Figure 28:
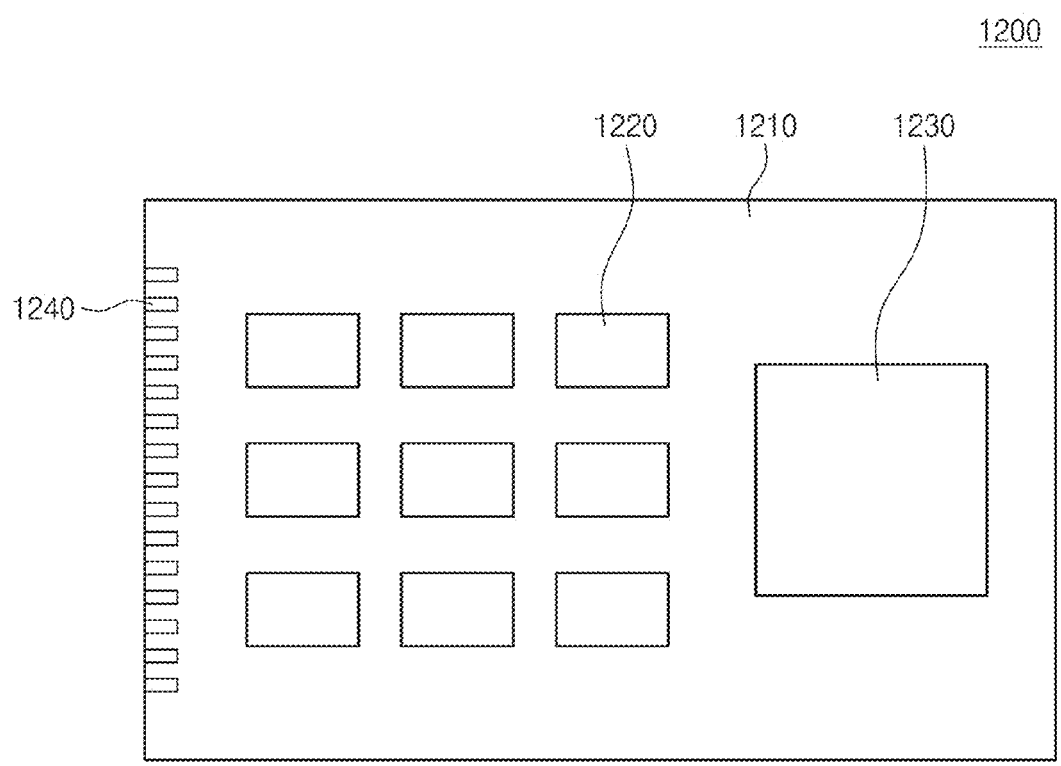
FIG. 28 is a view illustrating an example of package modules including semiconductor packages according to some example embodiments.

FIG. 28 is a view illustrating an example of package modules including semiconductor packages according to some example embodiments. Referring to FIG. 28, a package module 1200 may include a semiconductor integrated circuit chip 1220 and a semiconductor integrated circuit chip 1230 being packaged by a quad flat package (QFP). The semiconductor integrated circuit chips 1220 and 1230, to which the semiconductor package technique according to some example embodiments is applied, may be mounted on a module substrate 1210, thereby forming the package module 1200. The package module 1200 may connected to an external electronic device through external connection terminals 1240.

Figure 29:
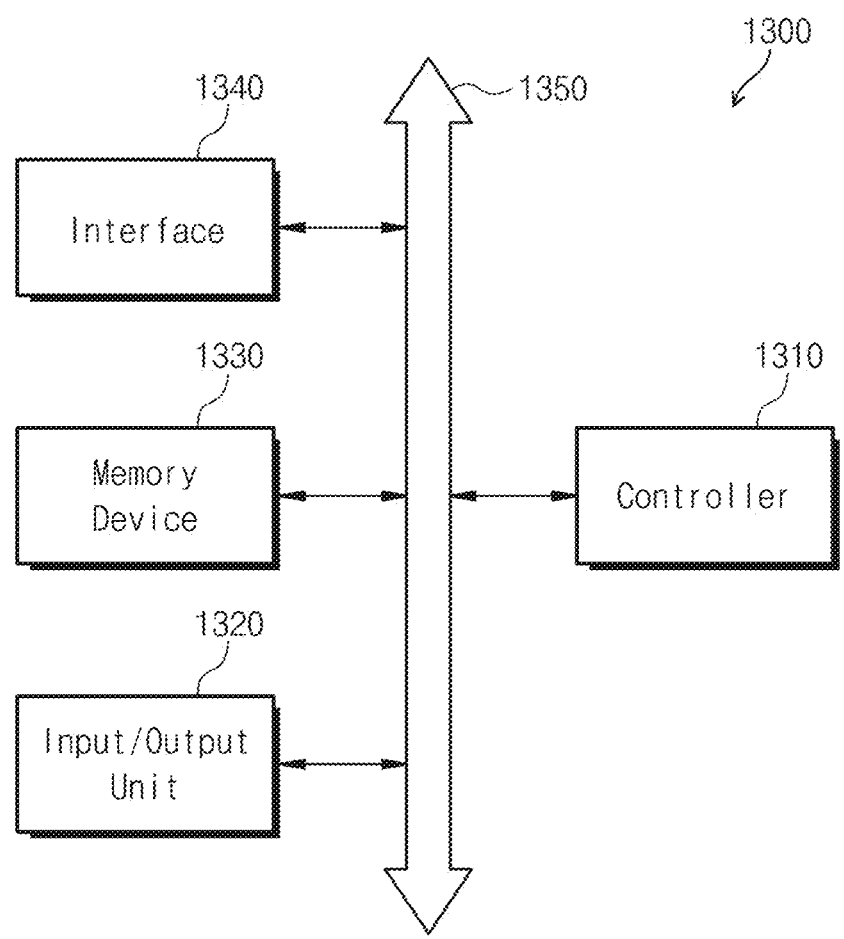
FIG. 29 is a block diagram illustrating an example of electronic devices including semiconductor packages according to some example embodiments.

The semiconductor package techniques described above may be applied to electronic systems. FIG. 29 is a block diagram illustrating an example of electronic devices including semiconductor packages according to some example embodiments. Referring to FIG. 29, an electronic system 1300 may include a controller 1310, an input/output unit 1320 and a memory device 1330. The controller 1310, the input/output unit 1320 and the memory device 1330 may be connected to each other through a bus 1350. The bus 1350 may correspond to a path through which electrical signals are transmitted. For example, the controller 1310 may include at least one of a microprocessor, a digital signal processor, a microcontroller or another logic device. The other logic device may have a similar function to any one of the microprocessor, the digital signal processor and the microcontroller. The controller 1310 and/or the memory device 1330 may include the semiconductor package according to some example embodiments. The input/output unit 1320 may include at least one of a keypad, a keyboard and a display device. The memory device 1330 may a device storing data. The memory device 1330 may store data and/or commands executed by the controller 1310. The memory device 1330 may include a volatile memory device and/or a non-volatile memory device. Or the memory device 1330 may be formed a flash memory. The memory device 1330 may include a solid state disk (SSD) being constituted by the flash memories. In this case, the electronic system 1300 may stably store mass data into the memory device 1330. The electronic system 1300 may further include an interface 1340 which may transmit electrical data to a communication network or may receive electrical data from a communication network. The interface 1340 may operate by wireless or cable. For example, the interface 1340 may include an antenna for wireless communication or a transceiver for cable communication. Although not shown in the drawings, the electronic system 1300 may further include an application chipset and/or a camera image processor (CIS).

The electronic system 1300 may be realized as a mobile system, a personal computer, industrial computer, or a logic system performing various functions. For example, the mobile system may be one of a personal digital assistant (PDA), a portable computer, a web tablet, a mobile phone, a wireless phone, a laptop computer, a memory card, a digital music player, and other electronic products. The other electronic products may receive or transmit information data. When the electronic system 1300 may operate by wireless, the electronic system 1300 may use a communication interface protocol such as third generation communication (e.g., code-division multiple access (CDMA), global system for mobile communications (GSM), North American digital cellular (NADC), extended time-division multiple access (E-TDMA), wideband CDMA (WCDMA), CDMA2000).

Figure 30:
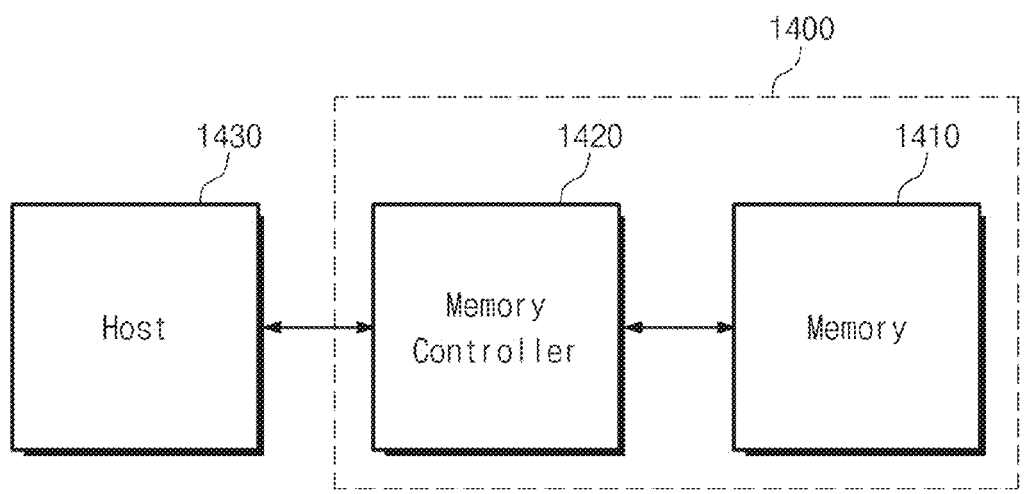
FIG. 30 is a block diagram illustrating an example of memory systems including semiconductor packages according to some example embodiments.

The semiconductor package techniques described above may be provided in the form of memory cards. FIG. 30 is a block diagram illustrating an example of memory systems including semiconductor packages according to some example embodiments. Referring to FIG. 30, a memory card 1400 may include a non-volatile memory device 1410 and a memory controller 1420. The non-volatile memory device 1410 and the memory controller 1420 may store data or read stored data. The non-volatile memory device 1410 may include at least one of non-volatile memory devices applied with the semiconductor package techniques according to some example embodiments. The memory controller 1420 may respond to read/write demands of a host 1430 to control the non-volatile memory device 1410, thereby sensing stored data or storing data.

In the semiconductor package according to some example embodiments, since the sidewall and the bottom of the recessed region of the insulating layer and the inner sidewalls of the holes may have the surface roughness, adhesion force between the interconnection and the insulating layer may be improved. Additionally, the insulating layer extends to cover the edge portions of the semiconductor chips and the package substrate so that the insulating layer covers portions of the neighboring chip connection terminals and the neighboring substrate connection terminals. Thus, the insulating layer protects the edge portions of the semiconductor chips and the package substrate to improve reliability of the semiconductor package. Moreover, since the interconnection is disposed on the insulating layer, a degree of freedom of an interconnection may increase. Furthermore, since the wire of the wire bonding process is not used, gold used as the wire is not required to be economical.

Additionally, since the interconnections are formed by the electroless plating method, a strip/panel-level batch process can be performed to improve productivity.

Furthermore, the semiconductor package according to other embodiments may include the first insulating layer including the metal-containing particles, and the second insulating layer covering the first insulating layer and not including a metal-containing particle. The metal-containing particles of the insulating layer may not be exposed by the second insulating layer. If the metal-containing particles are exposed on a surface of an undesired region during the electroless plating method, metal may be insignificantly extracted, and an undesired plating layer may be formed on the region in which the metal is extracted. However, according to other embodiments of the inventive concept, the second insulating layer covers the first insulating layer, such that the metal-containing particles are not exposed. Thus, a bridge fail and/or a short fail may be prevented. Additionally, the second insulating layer covers the semiconductor chip and the substrate, such that the semiconductor chip and the substrate may be protected from a chemical attack during the electroless plating method.

While example embodiments have been particularly shown and described, it will be understood by those of ordinary skill in the art that various changes in form and details may be made therein without departing from the spirit and scope of the present invention as defined by the following claims.

What is claimed is:

1. A method of forming a semiconductor package, the method comprising:
    preparing a substrate including a substrate connection terminal;
    stacking at least one semiconductor chip including a chip connection terminal on the substrate;
    forming a first insulating layer to cover the substrate connection terminal and the chip connection terminal;
    forming a recessed region in the first insulating layer such that a first thickness of the first insulating layer at the recessed region is smaller than a second thickness of the first insulating layer at a non-recessed region of the first insulating layer; and
    forming an interconnection penetrating the first insulating layer, the interconnection electrically connecting the chip connection terminal to the substrate connection terminal.

2. The method of claim 1, wherein the forming an interconnection is performed using an electroless plating method.

3. The method of claim 1, wherein
    the first insulating layer includes a polymer layer and metal-containing particles dispersed in the polymer layer, and
    the forming a recessed region in the first insulating layer includes,
    partially removing, by irradiating a laser, the polymer layer in the first insulating layer such that the recessed region at a surface of the first insulating layer and holes exposing the chip connection terminal and the substrate connection terminal are formed, while leaving the metal-containing particles in the recessed region and the holes.

4. The method of claim 3, wherein the laser breaks a bind ring between a non-metal atom and a metal in the metal-containing particles to form a seed layer including the metal.

5. The method of claim 4, further comprising:
    performing a pre-treatment process removing an insulating material of the metal-containing particles to form the seed layer including the metal in the metal-containing particles before forming the interconnection.

6. The method of claim 5, wherein the forming a first insulating layer comprises performing a chemical vapor deposition process to conformally form the first insulating layer on a top surface, a sidewall, and a bottom surface of the at least one semiconductor chip and a top surface of the substrate, and
    wherein the polymer layer includes parylene.

7. The method of claim 3, wherein the laser is an infrared laser.

8. The method of claim 3, further comprising:
    forming a laser blocking pattern on the chip connection terminal;

wherein the laser is irradiated to expose the laser blocking pattern on the chip connection terminal.

9. The method of claim 1, further comprising:
forming a second insulating layer to cover the substrate, the at least one semiconductor chip, and the first insulating layer;
wherein the interconnection penetrates the second insulating layer and the first insulating layer.

10. The method of claim 9, wherein the second insulating layer does not include metal-containing particles.

11. The method of claim 10, wherein the first insulating layer includes a polymer layer and metal-containing particles dispersed in the polymer layer, and
the forming a recessed region in the first insulating layer includes,
partially removing, by irradiating a laser, the second insulating layer and the polymer layer in the first insulating layer, such that the recessed region and holes, which expose the chip connection terminal and the substrate connection terminal, while leaving the metal-containing particles in the recessed region and in the holes.

12. A method of forming a semiconductor package, the method comprising:
stacking a second semiconductor chip including a second chip connection terminal on a first semiconductor chip including a first chip connection terminal;
forming at least one insulating layer to cover the first chip connection terminal and the second chip connection terminal;
forming a recessed region in the at least one insulating layer such that a first thickness of the at least one insulating layer at the recessed region is smaller than a second thickness of the at least one insulating layer at a non-recessed region of the at least one insulating layer; and
forming an interconnection penetrating the at least one insulating layer to electrically connect the first chip connection terminal to the second chip connection terminal.

13. A method of forming a semiconductor package, the method comprising:
preparing a substrate;
stacking two or more semiconductor chips on the substrate;
forming a first insulating layer on the substrate and the two or more semiconductor chips;
forming a recessed region in the first insulating layer such that a first thickness of the first insulating layer at the recessed region is smaller than a second thickness of the first insulating layer at a non-recessed region of the first insulating layer; and
forming an interconnection that penetrates the first insulating layer;
wherein the substrate includes a substrate connection terminal,
wherein each of the two or more semiconductor chips includes a chip connection terminal,
wherein the first insulating layer covers at least the substrate connection terminal and the chip connection terminals, and
wherein the interconnection electrically connects the substrate connection terminal and the chip connection terminals.

14. The method of claim 12, wherein the at least one insulating layer includes a polymer layer and metal-containing particles dispersed in the polymer layer, and
the forming a recessed region in the at least one insulating layer includes partially removing, by irradiating a laser, the polymer layer in the at least one insulating layer such that the recessed region at a surface of the at least one insulating layer and holes exposing the first and second chip connection terminals are formed, while leaving the metal-containing particles in the recessed region and the holes.

15. The method of claim 13, wherein the first insulating layer includes a polymer layer and metal-containing particles dispersed in the polymer layer, and
the forming a recessed region in the first insulating layer includes partially removing, by irradiating a laser, the polymer layer in the first insulating layer such that the recessed region at a surface of the first insulating layer and holes exposing the chip connection terminals and the substrate connection terminal are formed, while leaving the metal-containing particles in the recessed region and the holes.

* * * * *